United States Patent
Reznicek et al.

(10) Patent No.: US 10,991,711 B2
(45) Date of Patent: Apr. 27, 2021

(54) STACKED-NANOSHEET SEMICONDUCTOR STRUCTURES

(71) Applicant: International Business Machines Corporation, Armonk, NY (US)

(72) Inventors: Alexander Reznicek, Troy, NY (US); Bahman Hekmatshoartabari, White Plains, NY (US); Karthik Balakrishnan, Scarsdale, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/446,752

(22) Filed: Jun. 20, 2019

(65) Prior Publication Data

US 2020/0402984 A1  Dec. 24, 2020

(51) Int. Cl.
*H01L 27/1157* (2017.01)
*H01L 21/02* (2006.01)
(Continued)

(52) U.S. Cl.
CPC ...... *H01L 27/1157* (2013.01); *H01L 21/0217* (2013.01); *H01L 21/02192* (2013.01); *H01L 21/02532* (2013.01); *H01L 21/30604* (2013.01); *H01L 27/11524* (2013.01); *H01L 29/0673* (2013.01); *H01L 29/0847* (2013.01); *H01L 29/1037* (2013.01); *H01L 29/40117* (2019.08); *H01L 29/42348* (2013.01);
(Continued)

(58) Field of Classification Search
CPC ........... H01L 27/1157; H01L 27/11524; H01L 29/40117; H01L 29/42348; H01L 29/7881; H01L 29/785; H01L 29/66795; H01L 29/66825; H01L 21/30604; H01L 21/02532; H01L 21/0217; H01L 21/02192
USPC .............. 257/314, 315, 316, 319, 326, 401, 257/E27.103, E27.112, E27.067, E29.128, 257/E29.3, E29.302, E29.309, E21.209, 257/E21.334, E21.679, E21.682; 365/185.08, 185.18, 185.22; 438/197, 438/258, 283, 593
See application file for complete search history.

(56) References Cited

U.S. PATENT DOCUMENTS 6,255,205 B1   7/2001   Sung
7,126,854 B2  10/2006   Park
(Continued)

FOREIGN PATENT DOCUMENTS

EP      3339244 A1    6/2018

OTHER PUBLICATIONS

Han et al., "CdSe/ZnS core-shell quantum dots charge trapping layer for flexible photonic memory", 2015 Journal of Materials Chemistry C., 3, 11 pages.

*Primary Examiner* — Dao H Nguyen
(74) *Attorney, Agent, or Firm* — Stephen R. Yoder

(57) ABSTRACT

Semiconductor structures and methods of making the same. The semiconductor structures including at least two vertically stacked nanosheet devices. In one embodiment, an integrated circuit includes a plurality of horizontal nanosheet devices (HNS devices) that are stacked vertically, on top of each other, relative to a top surface of a substrate. The plurality of HNS devices including a first HNS device and a second HNS device that each have source and drain structures.

16 Claims, 22 Drawing Sheets

(51) Int. Cl.
*H01L 29/10* (2006.01)
*H01L 27/11524* (2017.01)
*H01L 29/423* (2006.01)
*H01L 29/78* (2006.01)
*H01L 29/788* (2006.01)
*H01L 29/792* (2006.01)
*H01L 29/66* (2006.01)
*H01L 21/306* (2006.01)
*H01L 29/08* (2006.01)
*H01L 29/49* (2006.01)
*H01L 29/06* (2006.01)
*H01L 21/28* (2006.01)

(52) U.S. Cl.
CPC ...... *H01L 29/4966* (2013.01); *H01L 29/6656* (2013.01); *H01L 29/66545* (2013.01); *H01L 29/66553* (2013.01); *H01L 29/66795* (2013.01); *H01L 29/66825* (2013.01); *H01L 29/66833* (2013.01); *H01L 29/785* (2013.01); *H01L 29/7881* (2013.01); *H01L 29/792* (2013.01)

(56) References Cited

U.S. PATENT DOCUMENTS

| | | | |
|---|---|---|---|
| 7,700,993 | B2 | 4/2010 | Cai et al. |
| 9,324,850 | B2 | 4/2016 | Kang et al. |
| 9,627,213 | B2 | 4/2017 | Hee et al. |
| 9,997,598 | B2 | 6/2018 | Smith et al. |
| 2006/0121661 | A1* | 6/2006 | Yang ................. H01L 21/28185 438/197 |
| 2009/0114971 | A1* | 5/2009 | Cai ..................... H01L 29/7881 257/315 |
| 2012/0156842 | A1* | 6/2012 | Jung ................. H01L 27/11558 438/258 |
| 2013/0082315 | A1* | 4/2013 | Hosoda ............. H01L 29/42364 257/315 |
| 2019/0355756 | A1* | 11/2019 | Nelson ............ H01L 21/823828 |
| 2020/0098756 | A1* | 3/2020 | Lilak ................. H01L 29/78696 |
| 2020/0105891 | A1* | 4/2020 | Lilak ................. H01L 29/4908 |
| 2020/0144264 | A1* | 5/2020 | Li ...................... H01L 29/0696 |

\* cited by examiner

STACKED-NANOSHEET SEMICONDUCTOR STRUCTURES

BACKGROUND

The present invention relates generally to the field of semiconductor devices, and more particularly to formation of Complementary Metal Oxide Silicon (CMOS) Electrically Programmable Read Only Memory (EPROM) and CMOS EEPROM (Electrically Erasable and Programmable Read Only Memory) devices.

In many applications, particularly in System-on-Chip (SoC) applications, designers want to have a certain number of embedded non-volatile memory devices on the microprocessor or Application-Specific Integrated Circuit (ASIC) chips. The preferred approach for meeting this need is to provide embedded non-volatile memories that require little or no additional process cost to the base logic technology. Often, the additional requirements for such embedded non-volatile memories are high density, i.e. small cell size, low power, and high speed.

SUMMARY

According to one embodiment of the present disclosure, a semiconductor structure is provided. The semiconductor structure includes a first transistor device stacked on top of a second transistor device, wherein the source and drain structures of the first transistor device are aligned with the source and drain structures of the second transistor device.

According to one embodiment of the present disclosure, the semiconductor structure includes a gate structure that controls a channel between the source and drain structures of the first transistor device.

According to one embodiment of the present disclosure, the semiconductor structure includes a stack of materials that (i) connects the source and drain structures of the first transistor device and (ii) connects the source and drain structures of the second transistor device.

According to one embodiment of the present disclosure, the first transistor device includes a first source/drain structure that is connected to a second source/drain structure by a first set of layered materials. According to one embodiment of the present disclosure, the second transistor device includes a third source/drain structure that is connected to a fourth source/drain structure by a second set of layered materials that is different from the first set of layered materials.

According to one embodiment of the present disclosure, the first set of layered materials includes alternating layers of silicon and gate material. The second set of layered materials includes alternating layers of silicon and storage dielectric.

According to one embodiment of the present disclosure, the second set of layered materials includes layers of material that can form quantum dots.

According to one embodiment of the present disclosure, the second set of layered materials includes layers of annealed silicon oxide.

According to one embodiment of the present disclosure, each of the source and drain structures of the first transistor device second transistor device are physically connected to one of three electrical contacts.

According to one embodiment of the present disclosure, the semiconductor structure includes a first electrical contact, of the three electrical contacts, that is connected to a first source and drain structure of the first transistor device.

According to one embodiment of the present disclosure, the semiconductor structure includes a second electrical contact, of the three electrical contacts, that connects a second source and drain structure of the first transistor device to a third source and drain structure of the second transistor device, wherein the third source and drain structure is located beneath the first source and drain structure.

According to one embodiment of the present disclosure, the semiconductor structure includes a third electrical contact, of the three electrical contacts, that is routed from outside the drawing plane and is in electrical contact with a top of a fourth source and drain structure of the second transistor device.

According to one embodiment of the present disclosure, the second electrical contact is a shared drain terminal that has a top surface that is covered by dielectric material.

According to one embodiment of the present disclosure, the first transistor device and the second transistor device comprise a pair of transistor devices that comprise one nFET transistor device and one pFET transistor device.

According to one embodiment of the present disclosure, the semiconductor structure comprises one of either (i) a Complementary Metal Oxide Silicon (CMOS)/Erasable Programmable Read-Only Memory (EPROM) cell or (ii) a CMOS programmable inverter structure. According to one embodiment of the present disclosure, the CMOS/EPROM cell comprises either (i) an nFET stacked on top of a floating-gate pFET or (ii) a pFET stacked on top of a floating-gate nFET. According to one embodiment of the present disclosure, the CMOS programmable inverter structure comprises a shared drain that is electrically connected to a signal out terminal ($V_{out}$) and either (i) an nFET stacked on top of an pFET or (ii) a pFET stacked on top of an nFET.

According to one embodiment of the present disclosure, a method of forming a semiconductor structure is provided. The method includes: forming a first transistor device on top of a second transistor device, wherein the source and drain structures of the first transistor device are aligned with the source and drain structures of the second transistor device.

According to one embodiment of the present disclosure, the first transistor device and the second transistor device comprise a pair of transistor devices that comprise one nFET transistor device and one pFET transistor device.

According to one embodiment of the present disclosure, the semiconductor structure comprises one of either (i) a Complementary Metal Oxide Silicon (CMOS)/Erasable Programmable Read-Only Memory (EPROM) cell or (ii) a CMOS programmable inverter structure. According to one embodiment of the present disclosure, the CMOS/EPROM cell comprises either (i) an nFET stacked on top of a floating-gate pFET or (ii) a pFET stacked on top of a floating-gate nFET. According to one embodiment of the present disclosure, the CMOS programmable inverter structure comprises a shared drain that is electrically connected to a signal out terminal ($V_{out}$) and either (i) an nFET stacked on top of an pFET or (ii) a pFET stacked on top of an nFET.

BRIEF DESCRIPTION OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
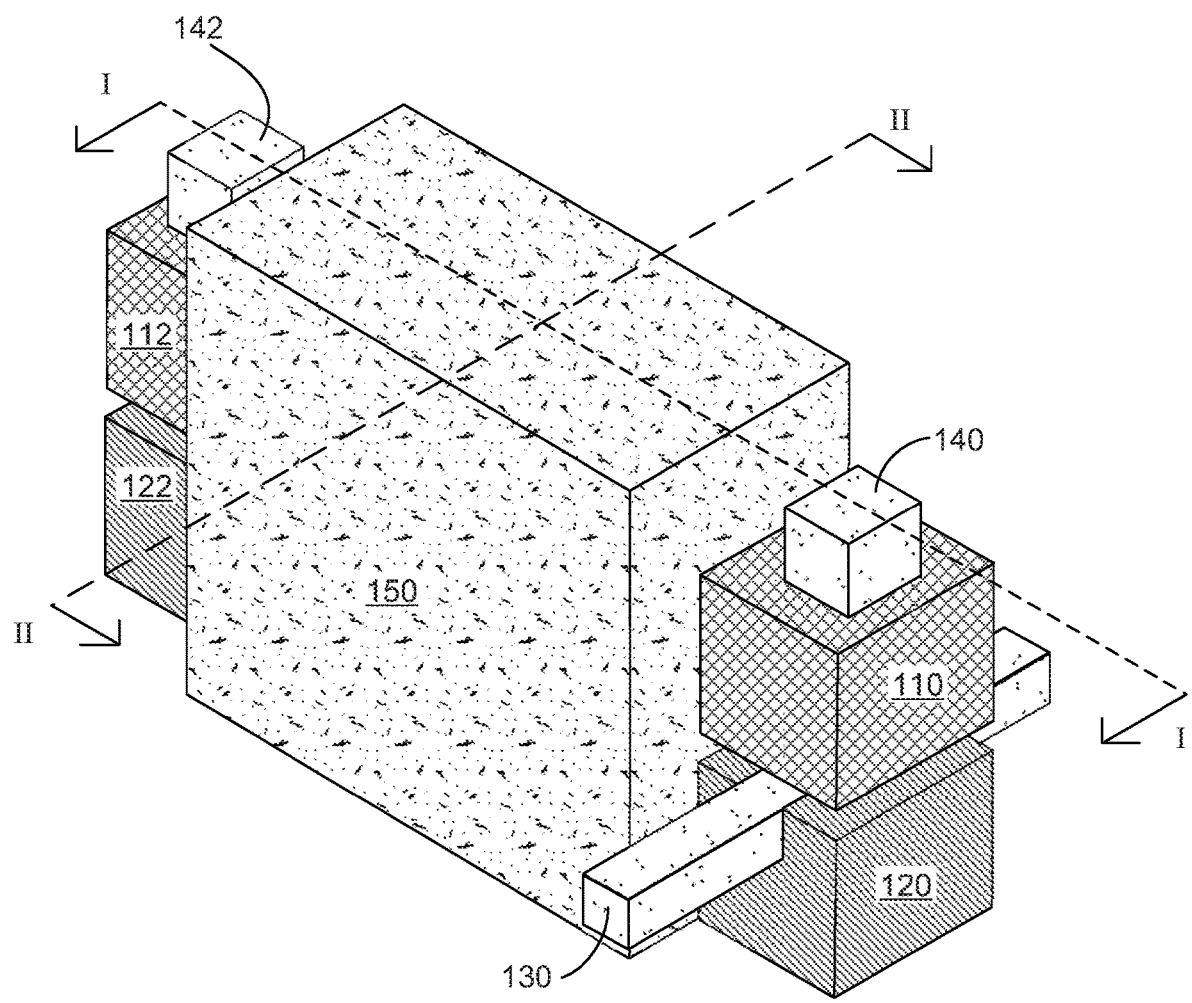
FIG. 1 is a perspective view of a semiconductor device, according to a first embodiment of the present invention.

EPROM (erasable programmable read-only memory) is programmable read-only memory (programmable ROM) that can be erased and re-used. An EPROM is comprised of an array of floating gate transistors that can be programmed electrically, i.e. by applying programming voltages to individual floating gate transistors. Programming involves trapping of charge carriers (e.g. "hot" electrons accelerated by an electric field produced within a floating gate transistor by applying a programming voltage) in the floating gate. Erasure may be caused by shining an intense ultraviolet light through a window that is designed into the memory chip.

Embodiments recognize that certain existing memory cells can (i) exhibit high programming voltage required and have (ii) non-planar cell topography due to the presence of the floating gate electrode.

Embodiments recognize that may be desirable to use an access or select transistor connected in series with the memory element to form the non-volatile memory cell. While adding a select transistor adds area to the memory cell, the addition of the select transistor can reduce or eliminate addressing issues such as crosstalk between memory cells.

Embodiments recognize that, for the select transistor, it may be desirable to use an n-channel FET, instead of a p-channel FET, because an n-channel FET typically has twice the performance as a p-channel FET due to higher electron mobility. In other words, may be desirable to have a CMOS non-volatile memory device where the n-channel FET is used as an access transistor and the floating-gate p-channel FET is used as the memory element.

Embodiments recognize the limited amount space available for most semiconductor structures. Embodiments further recognize that solutions that better utilize that limited amount space provide an improvement to the field of semiconductor structures. Embodiments of the present invention provide a Nanosheet CMOS EPROM cell and a Nanosheet CMOS programmable inverter structure integrated in stacked nanosheet transistor flow. One embodiment provides an nFET that is stacked directly on top of a floating-gate pFET. One embodiment provides an EPROM cell/CMOS programmable inverter that consists of the pFET stacked directly on top of the floating-gate nFET. Thus, in various embodiments one EPROM cell/CMOS programmable inverter takes the footprint area of only one device instead of the combined footprint areas of both devices. Some embodiments further provide enhanced charge retention in gate material by the formation of silicon-based quantum dots in the gate material.

Embodiments provide a nanosheet FET that is configured to form a nonvolatile memory. As such, certain embodiments provide structures, fabrication methods, and operation procedures than enable "nonvolatile" memory elements. Certain embodiments realize one or more advantages specific to the disclosed semiconductor memories, such as, but are not limited to, increased cell density per unit of wafer space and increased response speed, i.e., a decrease in the time required to receive a response to one or both of read and write memory operations. Certain embodiments provide a stacked-nanosheet structure, where both of the stacked devices each contain multiple conducting nanosheet channels. Certain embodiments provide a semiconductor structure that has operation parameters in which UV is only required for memory erasing while the programming can be readily achieved, electrically, through electron tunneling and/or hot electron injection.

In accordance with the present invention, the memory element is fully compatible with CMOS logic process, and both memory and logic elements are made, in a stacked configuration, on the same silicon chip.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-22, embodiments may include semiconductor structures and methods of forming semiconductor devices with a FET that is stacked on top of a floating-gate FET. For example, an EPROM cell/CMOS programmable inverter. The method described below in conjunction with FIGS. 1-22 may be incorporated into typical semiconductor fabrication processes, such as fabrication processes for read-only programmable memory.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, semiconductor structures refer to one or more physical structures that comprise semiconductor devices.

As used herein, terms such as "depositing", "forming", and the like may refer to the disposition of layers, or portions of materials, in accordance with a given embodiment. Such processes may or may not be different than those used in the standard practice of the art of semiconductor device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

The present invention will now be described in detail with reference to the Figures.

FIG. 1 is a perspective view of a semiconductor device, according to a first embodiment of the present invention. The semiconductor structure includes an nFET structure stacked on top of a pFET structure. The nFET structure includes source/drain regions 110 and 112. The pFET structure includes source/drain regions 120 and 122. In the depicted embodiment, source/drain regions 110 and 112 are composed of silicon doped with phosphorus, forming an nFET. In the depicted embodiment, source/drain regions 120 and 122 are composed of silicon-germanium doped with boron, forming an pFET. As shown, the nFET structure are stacked on top of the pFET structures. In this embodiment, an electrical contact 142 is depicted, which forms electrical connections with both source/drain regions 112 and 122, e.g., forms a silicide strap n+ and p+ for source/drain regions 112 and 122. In this embodiment, an electrical contact 140 is depicted, which forms an electrical connection with source/drain region 110, i.e., an nFET contact (Vss). In this embodiment, an electrical contact 130 is depicted, which forms an electrical connection with source/drain region 120, i.e., electrical contact 130 represents an pFET contact (Vdd). Finally, FIG. 1 depicts a gate structure, 150, that is covering the stacked sheets of material that (i) connect source/drain region 110 to source/drain region 112 and (ii) connect source/drain region 120 to source/drain region 122. As shown with reference to FIG. 11-22, gate structure 150 of FIG. 1 represents a number of materials, and layers/structures thereof, as arranged and described herein.

Figure 21:
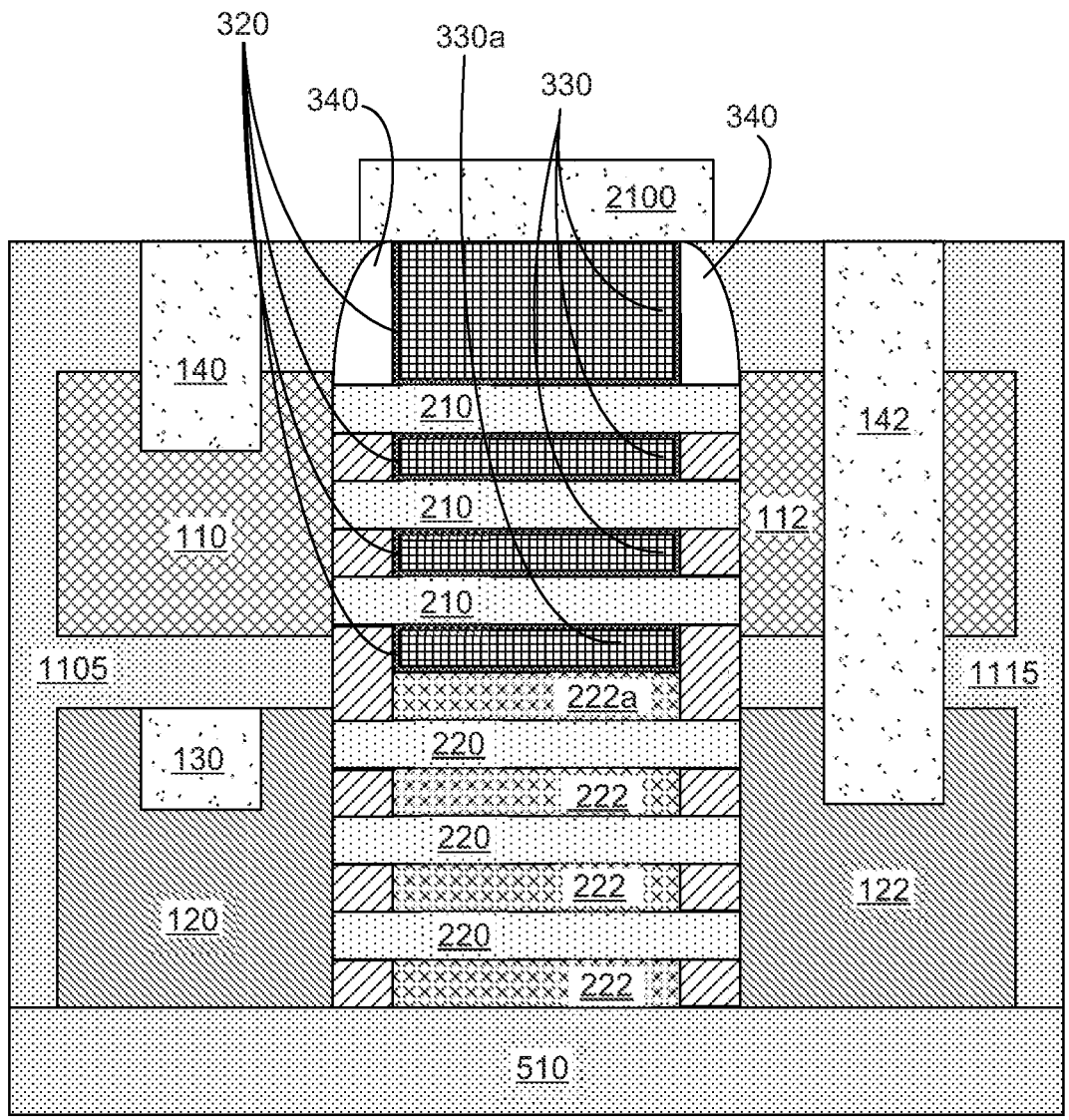
Figure 22:
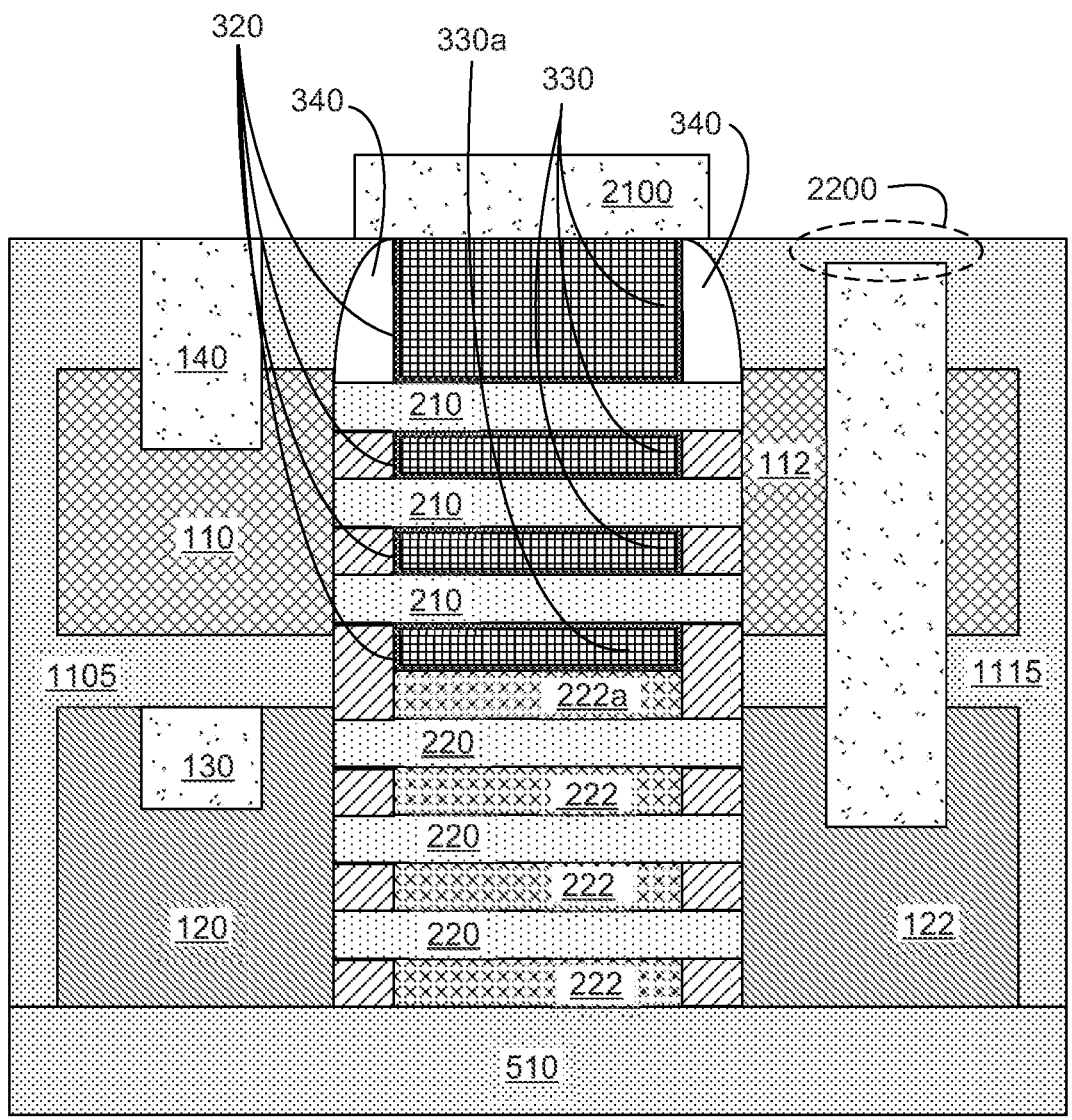

In one embodiment, referring to FIG. 1, electrical contact 140 connects a power supply terminal Vss, or a ground voltage (which equals zero Volts), to source/drain region 110 of the FET device that includes source/drain regions 110 and 112. A gate electrode, which is shown in FIGS. 21 and 22 as gate electrode 2100, is connected to gate structure 150, at the input potential $V_{IN}$. The electrical contact 130 is connected to a power supply terminal Vdd. In one embodiment, the electrical contact 142 is connected to an output terminal ($V_{OUT}$) and can provide an electrical signal. In such an embodiment, if the drain node voltage on electrical contact 142 is taken as an output voltage $V_{OUT}$; and the gate voltage is taken as an input voltage $V_{IN}$, then the resulting semiconductor device comprises a programmable CMOS inverter. In another embodiment, the electrical contact 142 is floating, i.e., the drain node represented by electrical contact 142 is floating, i.e., not connected to an output terminal, and is not used to provide an electrical signal. In such an embodiment, the resulting semiconductor device constitutes a non-volatile EPROM device. In such as embodiment, electrical contact 140 connects a select line terminal $V_{SL}$, to source/drain region 110 of the FET device that includes source/drain regions 110 and 112. A gate electrode, which is shown in FIGS. 21 and 22 as gate electrode 2100, is connected to gate structure 150, at the word-line terminal $V_{WL}$. The electrical contact 130 is connected to a bit-line terminal $V_{BL}$.

While the embodiments depicted herein illustrate and describe a semiconductor structure with two vertically stacked transistors structures, embodiments are not limited thereto. Embodiments recognize that there are a variety of semiconductor component combinations that can be formed by vertically stacking such semiconductor structures and the present disclosure encompasses such semiconductor structures.

Figure 2:
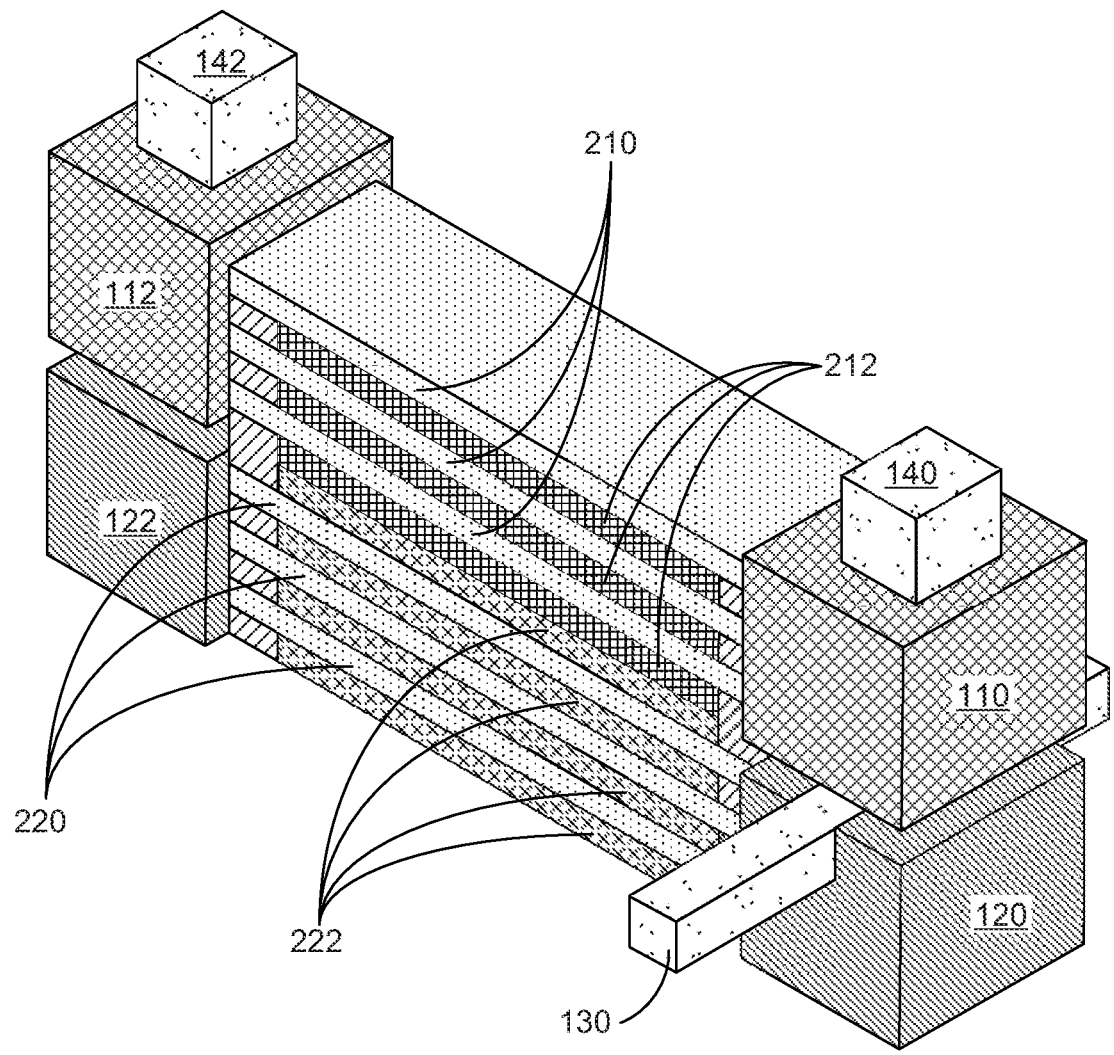
FIG. 2 is a perspective view of the semiconductor device of FIG. 1 with the gate structure removed, according to an embodiment of the present invention.

FIG. 2 is a perspective view of the semiconductor device of FIG. 1 with the gate structure removed, according to an embodiment of the present invention. As is shown in FIG. 2, alternating sheets of silicon, 210, and gate structures, 212, connect source/drain region 110 to source/drain region 112. Similarly, alternating sheets of silicon channels, 220, and storage dielectric, 222, connect source/drain region 120 to source/drain region 122. Note that while the illustrative embodiments include silicon channels 220, which are made of silicon, in other embodiments, corresponding structures made be formed of semiconductor materials other than silicon (e.g. germanium, silicon-germanium or III-V). Note that gate structures 212 are described in further detail herein with reference to at least FIGS. 3, 18, and 19. Also note the spacers, which are denoted as spacers 310 in FIG. 3, which are located (i) between the ends of gate structures 212 and source/drain regions 110 and 112 and (ii) between the ends of storage dielectric 222 and source/drain regions 120 and 122.

Figure 3:
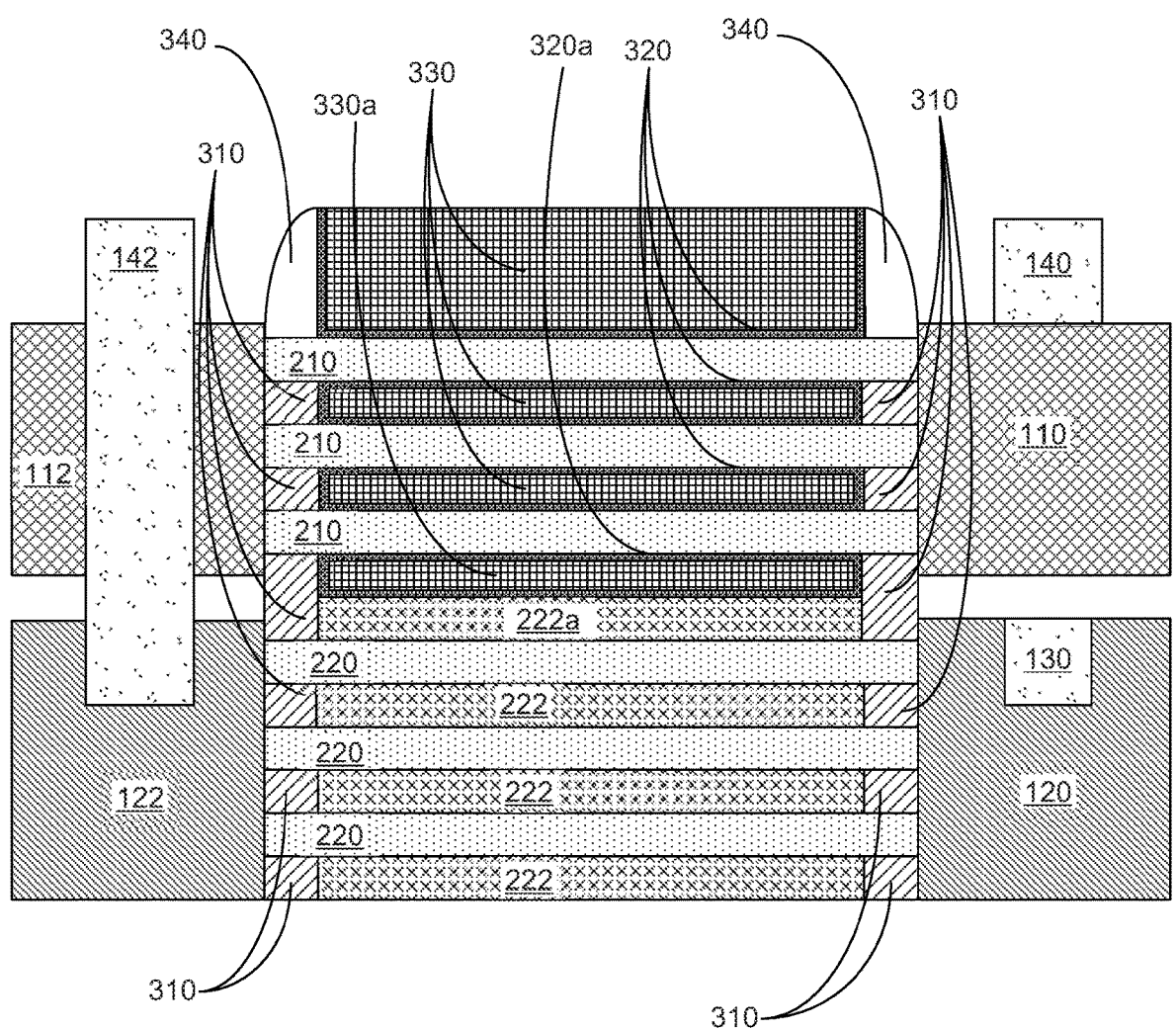
FIG. 3 is a cross-sectional view of the semiconductor device shown in FIG. 1 taken along line I-I of FIG. 1.

FIG. 3 is a cross-sectional view of the semiconductor device shown in FIG. 1 taken along line I-I of FIG. 1. As can be seen in FIG. 3, each of the gate structures 212 of FIG. 2, are each further comprised of layers of a high-k dielectric material, 320, that at least partially surround layers of gate material, 330 and 330a, such that they abut at least certain surfaces of respective layers of high-k dielectric material 320.

As seen in FIG. 3, layers of high-k dielectric material 320 separate the top and bottom surfaces of sheets of silicon channels 210 from certain top and bottom surfaces of portions of gate material 330 and 330a that are between the sheets of silicon channels 210 as well as the top of a portion of storage dielectric, denoted as 222a. As shown in FIG. 3, the ends of the gate structures (composed of respective high-k dielectric material 320 and 320a and layers of gate material 330 and 330a) are separated from source/drain regions 110 and 112 by spacers 310. Similarly, the ends of portions of storage dielectric 222 and 222a are separated from source/drain regions 120 and 122 by spacers 310.

Further, as can be seen, certain spacers 310, and the ends of sheets of silicon channels 210, abut source/drain regions 110 and 112. In contrast, other spacers 310, and the ends of sheets of silicon channels 220, abut source/drain regions 120 and 122. In this embodiment, some, but not all, of spacers 310 have a height, i.e., a material thickness, of a single layer of material as is depicted the stack of material layers.

As used herein, the stack of layers is generally defined as the layers of material that are located beneath gate spacers 340 starting at the top-most sheet of silicon channels 210 and ending at the bottom-most layer that includes a portion of storage dielectric 222. It is to be noted that one of the spacers 310 abuts both source/drain regions 110 and 120 while another particular spacer 310 abuts both source/drain regions 112 and 122. As shown, these two particular spacers 310 have a thickness that is greater than the other spacers 310. The thicknesses of these two particular spacers are approximately double that of the other spacers, i.e., these two particular spacers have a thickness corresponding to two layers of material in the stack of layers, i.e., the combined thickness of portion of storage dielectric 222a, high-k dielectric material 320a, and portion of gate material 330a. In contrast, the other spacers have a thickness that is equivalent to either the thickness of portion of storage dielectric 222a or the combined thicknesses of high-k dielectric material 320a and portion of gate material 330a.

Figure 4:
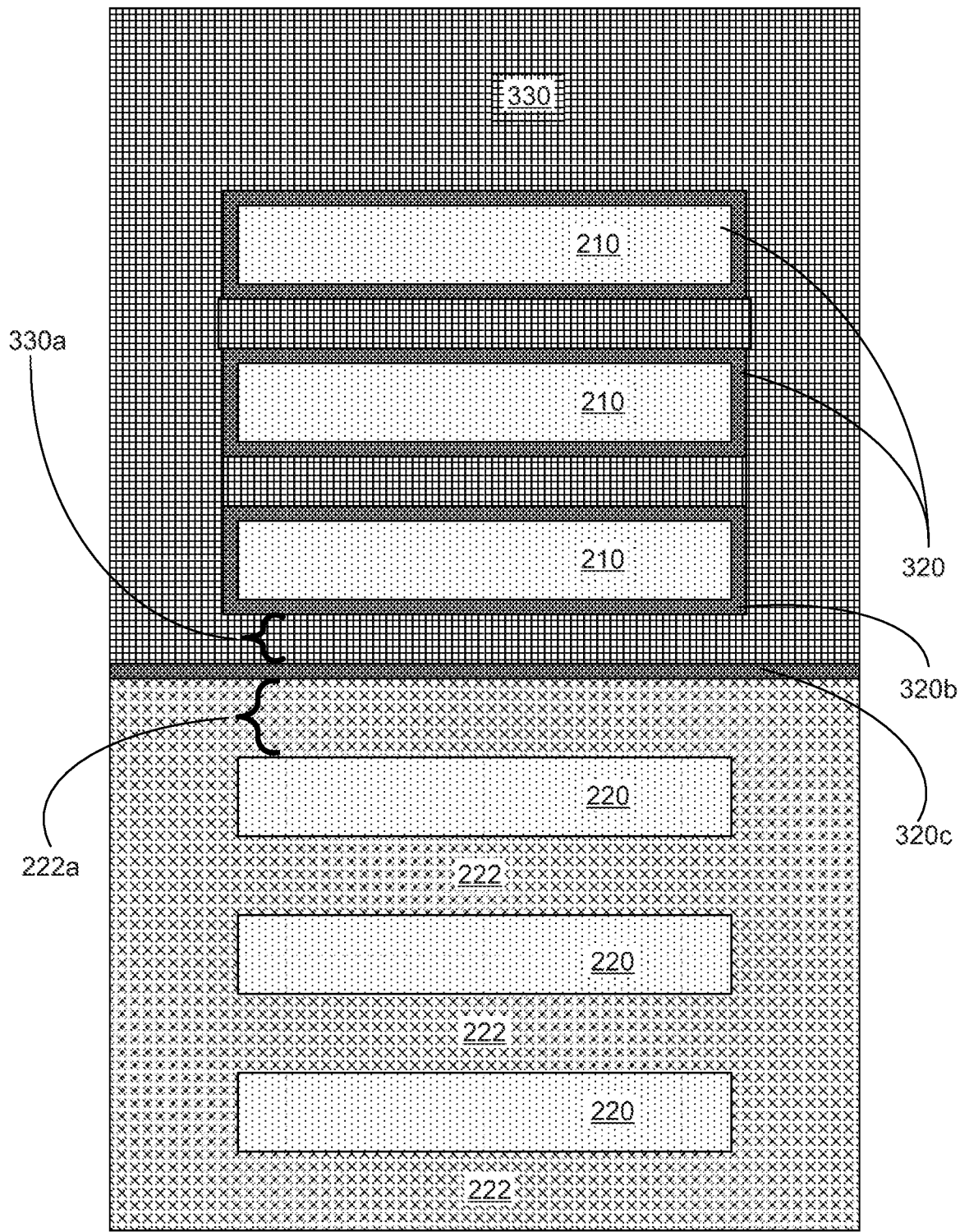
FIG. 4 is a cross-sectional view of the semiconductor device shown in FIG. 1 taken along line II-II of FIG. 1.

FIG. 4 is a cross-sectional view of the semiconductor device shown in FIG. 1 taken along line II-II of FIG. 1. As illustrated in FIG. 4, there is a layer of high-k dielectric material, denoted high-k dielectric material 320c, that separates gate material 330 and storage dielectric 222. Storage dielectric 222 can be seen surrounding the tops, sides and bottoms of sheets of silicon channels 220. Further, there is a layer of high-k dielectric material, denoted high-k dielectric material 320b, whose bottom portion is shown as being included as part of high-k dielectric material, denoted high-k dielectric material 320a in FIG. 3, i.e., the bottom portion of high-k dielectric material 320b and the high-k dielectric material 320c are included as part of high-k dielectric material 320a. Further, the general locations of the portion of gate material 330a and the portion of storage dielectric 222a are respectively indicated using likewise numbered brackets.

Certain embodiments of the present invention comprise nano-sheet FET devices, which include stacks of nano-sheets of various materials, e.g., lateral nano-sheets (LNS, also known as horizontal nano-sheets or HNS). HNS may be considered variations of horizontal nano-wires (HNW) with the wires widened. The HNS may be epitaxial-silicon grown and be separated by sacrificial silicon-germanium (SiGe) spacer layers. Certain embodiments of the present invention comprise integrated circuits comprising a plurality of horizontal nanosheet (HNS) devices on a top surface of a substrate, the plurality of HNS devices comprising a first HNS device and a second HNS device that are adjacent to each other in a vertical direction of the integrated circuit, i.e., vertical relative to the horizontal substrate.

Integrated circuits including field-effect transistors (FETs) with multiple threshold voltages (Vt) are often utilized in order to optimize the delay in switching or power leakage. As the size of integrated circuits decreases, it has become desirable to increase the density of the FETs on a substrate. Horizontal nanosheet field-effect transistor (HNS-FET) devices include multiple horizontal nanosheets serving as conducting channel regions to enable larger effective conduction width in a small layout area overlying a substrate. There are often several desired features that can be provided by certain HNS-FET structures. For example, the channel thickness of an HNS-FET can be finely tuned, and two or more nanosheets can be stacked over one another at the same layout area.

It may also be highly desirable to have small vertical spacing (VSP) between adjacent nanosheets in a stack of nanosheets to reduce the parasitic capacitance associated with the HNS-FET, so as to improve circuit speed. For example, the VSP (the thickness between the bottom surface of a first nanosheet and the top surface of an adjacent second nanosheet) may range from 5 nm to 15 nm. However, the VSP must be of a sufficient value to accommodate the gate stack to be formed therein. A gate stack generally includes a work function metal (WFM) that sets the threshold voltage (Vt) of the device, a high-k (HK) gate dielectric material separating the WFM from the nanosheets, and other metals that may be desired to further fine tune the effective work function (eWF) and/or to achieve a desired resistance value associated with current flow through the gate stack in the direction parallel to the plane of the nanosheets. Hereinafter, a "gate dielectric layer", "high-k dielectric layer", and a "HK dielectric layer" are used interchangeably. Due to limitations and in the interest of clarity, certain embodiments herein include WFM and portions of high-k (HK) gate dielectric material can include such WFM. Further, the methods of formation of such structures also include one or more processes for the deposition of such WFM on top of high-k (HK) gate dielectric material before the addition of bulk gate material.

The deposition of the WFM layer may be after the depositing of the high-K dielectric layer, and the deposition of the high-k dielectric layer may be after the trimming of the thickness of the horizontal nanosheets in a stack. The trimming of the thickness may be through a method selected from the group consisting of diluted HF etching, SiCoNi dry etching, chemical oxide removal (COR) process, atomic layer etching, and combinations thereof. The depositing of the WFM layer may be conducted utilizing atomic layer deposition (ALD).

Further, in related integrated circuits with multiple threshold voltage (multiple Vt or mVt) devices, the desired Vt value for each of the HNS devices is achieved by utilizing different work function metals for each of the HNS devices, due to the need of different effective work functions associated with each of the multiple Vt values. As such, the deposition of the WFM for each of the HNS devices may require a separate processing step.

For an n-channel field-effect transistors (nFETs), the WFM layers may include one or more reactive metals (RM) for tuning the Vt by tuning the effective work function (eWF) of the nFETs. For p-channel field-effect transistors (pFETs), the WFM layers may include one or more mid-gap metals (MM) with or without one or more reactive metals (RM) for tuning the Vt of the pFETs. The reactive metal may be any suitable reactive metal, such as Al, Hf, Ti, Zr, La, TiAC, or any other suitable transition metal for which Vt can be modulated by a change in the thickness of the WFM layer. The mid-gap metal may be any suitable mid-gap metal, such as TaN, TiN, TiTaSiN, or any other suitable metal for which Vt can be modulated by a change in the thickness of the WFM layer. The HK dielectric layer may be formed of any suitable high-k dielectric material, such as $Al_2O_3$ and/or $HfO_2$. The protective layer may be formed of any suitable materials, such as TiN.

FIGS. 5 to 21 and 22 are perspective views depicting illustrative steps of a method for manufacturing semiconductor devices according to select embodiments of the present invention. One having ordinary skill in the art appreciates that there are many options available for the formation of the structures described herein and that the following discussion does not limit embodiments to only the techniques described hereinafter.

Figure 5:
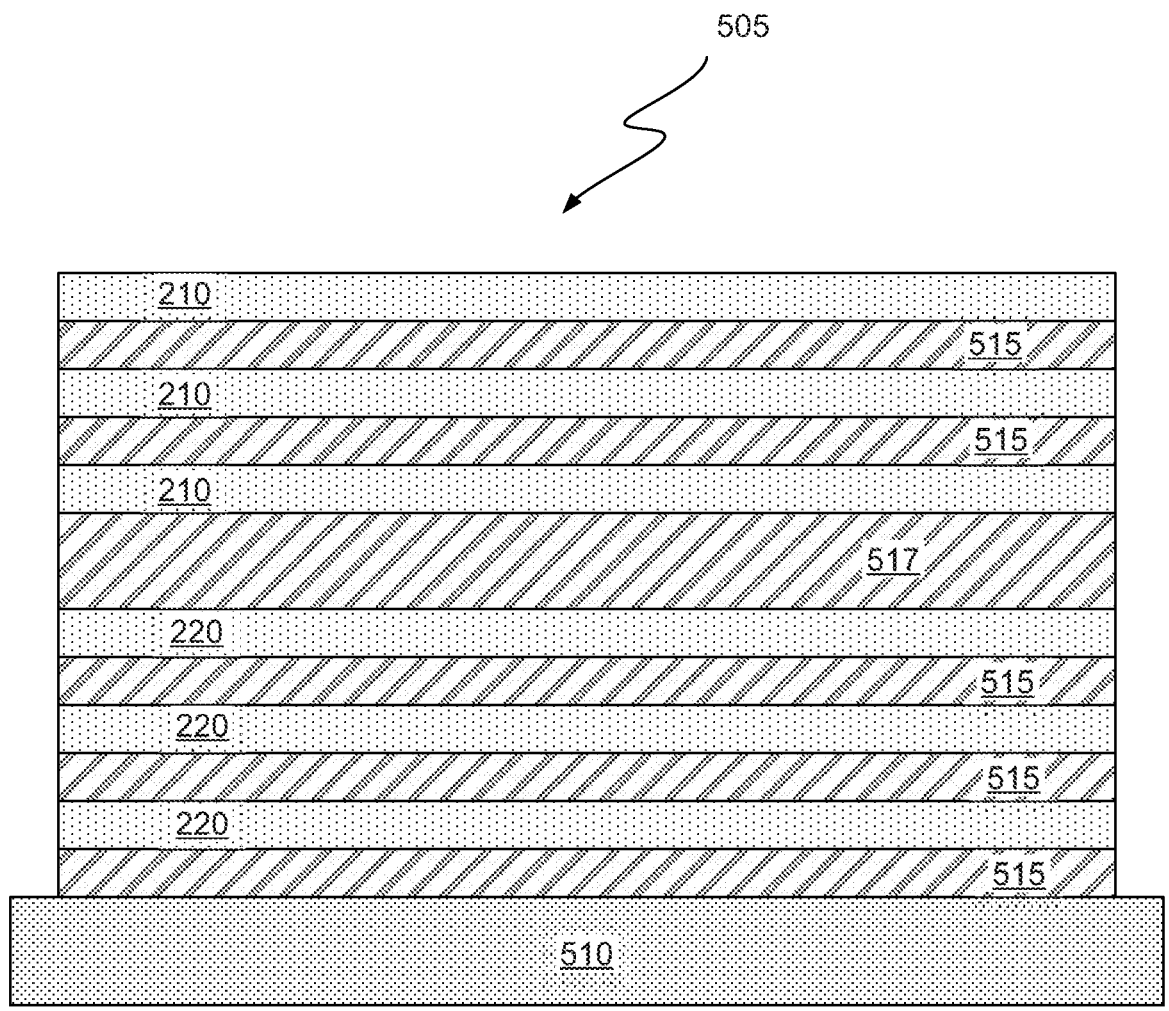
FIGS. 5 to 22 are perspective views of semiconductor devices that result from various illustrative steps of a method for manufacturing those semiconductor devices according to select embodiments of the present invention.

FIG. 5 depicts a formation of stack of material layers, 505. In general, FIG. 5 depicts a formation of a stack of alternating nanosheets of Silicon (Si) and Silicon-Germanium (SiGe). In general, the length of such nanosheets can vary between embodiments. However, in the disclosed embodiments, the width of the nanosheets may be in the range of 20-50 nm. Further, the thickness of nanosheets can vary depending on the material. For example, nanosheets of Si may have a thickness range of 6-8 nm, while nanosheets of SiGe may have a thickness range of 6-10 nm, but the thicknesses of such nanosheets are not limited thereto. The stack of material layers 505 may include epitaxially grown multi-stack of Si/SiGe layers with SiGe as the sacrificial layer for silicon channels. A Germanium (Ge) content of the SiGe layer may be about 10% to about 90% based on a total mole amount of Si and Ge. In one embodiment, the Germanium (Ge) content of the SiGe layer is between 20-65%. In some embodiments, the sacrificial layers may include carbon-doped SiGe (SiGeC). In this embodiment, these layers of material are un-doped semiconductors or i-type semiconductors (e.g., doping concentration is less than $10^{16}$ cm$^{-3}$). In this embodiment, stack of material layers 505 has alternating layers of silicon channels (210 and 220) and layers of sacrificial material (515 and 517). In this embodiment, layers of silicon channels 210 and 220, as well as the sacrificial SiGe layers 515 and 517, are formed using an epitaxial growth process. In this embodiment, layers of sacrificial material 515 and 517 are composed of 25% Silicon-Germanium. Stack of material layers 505 is formed on a substrate, 510. For example, substrate 510 may be formed of Silicon with a local bottom isolation layer of $SiO_2$. In general, the creation of the stack of layers is accomplished using any combination of known techniques for the deposition of layers of materials known in the arts.

In one embodiment, layers of sacrificial material 515 and 517 are composed of Silicon-Germanium (SiGe) (i.e., a molar ratio of silicon and germanium that forms an alloy with the ratio $Si_{1-x}Ge_x$). In one embodiment, the layers of Silicon-Germanium are epitaxially grown on substrate 510. The epitaxial process may be selective, meaning no material grows on surfaces covered by, for example, a liner material. In one such embodiment, such liner portions may later be removed using, for example, a selective wet etching process. A subsequent layer of silicon may then be formed on top of the layer of Silicon-Germanium. However, those skilled in the art understand that many different techniques may be used to remove various materials and portions thereof.

Figure 6:
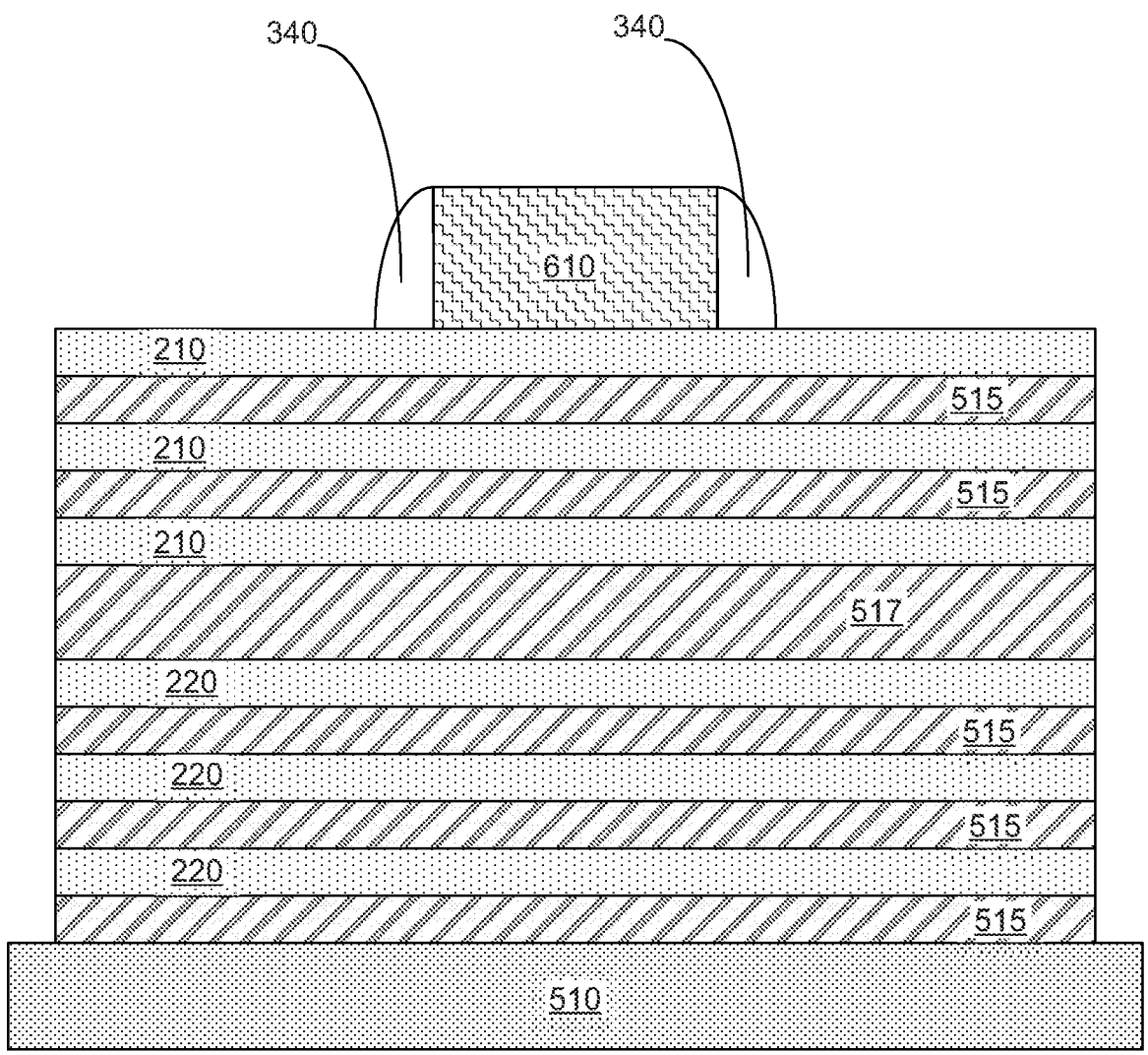

FIG. 6 depicts forming gate spacers 340 and a portion of dummy gate material 610 on stack of material layers 505. In general, the creation of the stack of layers is accomplished using any combination of known techniques for the deposition of layers of materials known in the arts. In one embodiment dummy gate material 610 comprises a portion of dummy gate oxide 45. In one embodiment gate spacers 340 comprises silicon nitride. In other embodiments, the spacer material of gate spacers 340 may be silicon nitride, SiBCN, SiOCN, SiON, or SiC, or combinations thereof. In one embodiment gate spacers 340 comprises silicon nitride (SiBCN). The formation of such dummy gates and spacers are well understood by those skilled in the art and, as such, a more detailed description of such processes is not presented herein.

Figure 7:
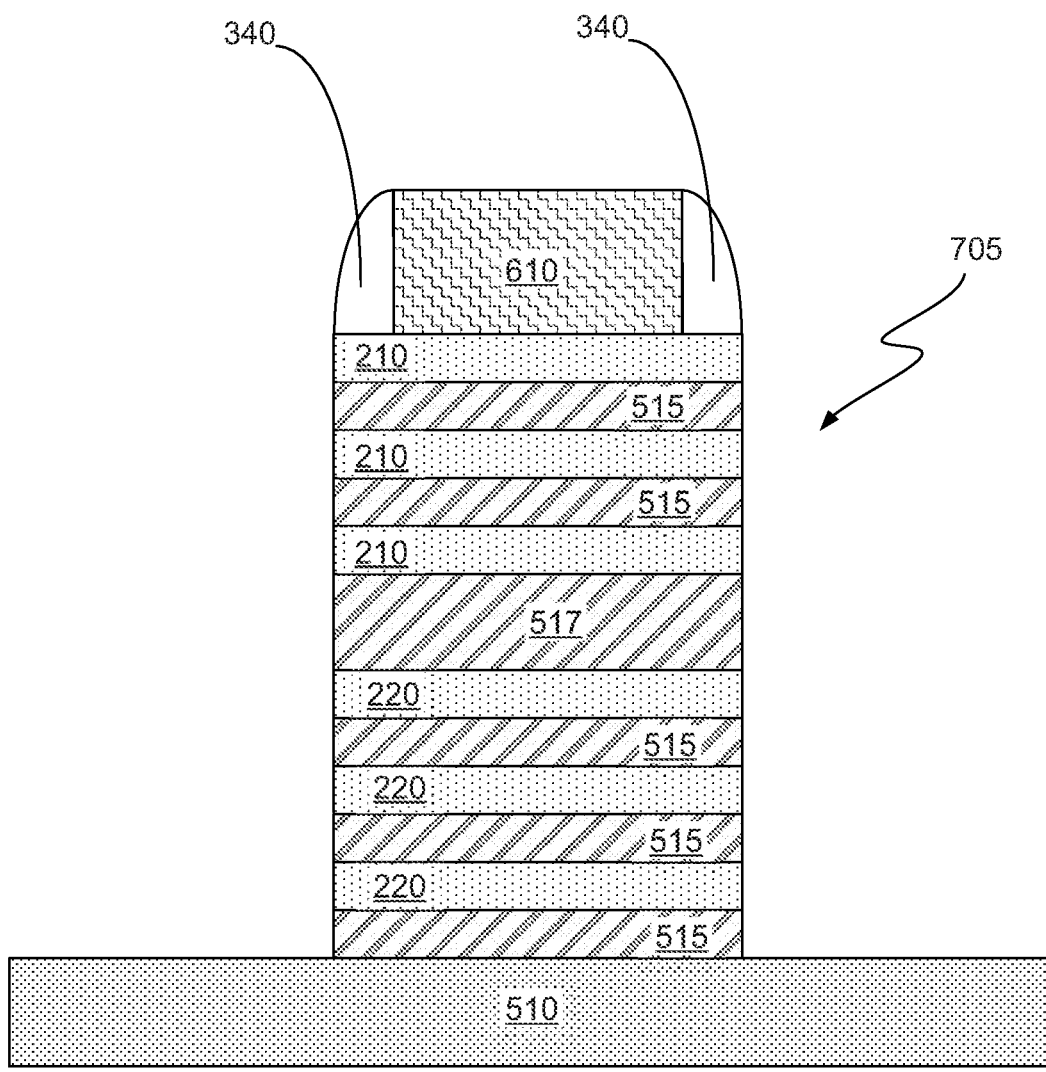

FIG. 7 depicts forming a stack portion, 705, of stack of material layers 505 based, at least in part, on the dimensions of a mask composed of gate spacers 340 and a portion of dummy gate material 610, i.e., the width of gate spacers 340 and a portion of dummy gate material 610. In general, the width of the resulting stack is substantially the same as that of the layers depicted in FIG. 1-4. The removal of excess material to form stack portion 705 can be accomplished using one or more etching techniques. The techniques for removal of unwanted/excess material is well understood by those skilled in the art and, as such, a more detailed description of such processes is not presented herein.

Figure 8:
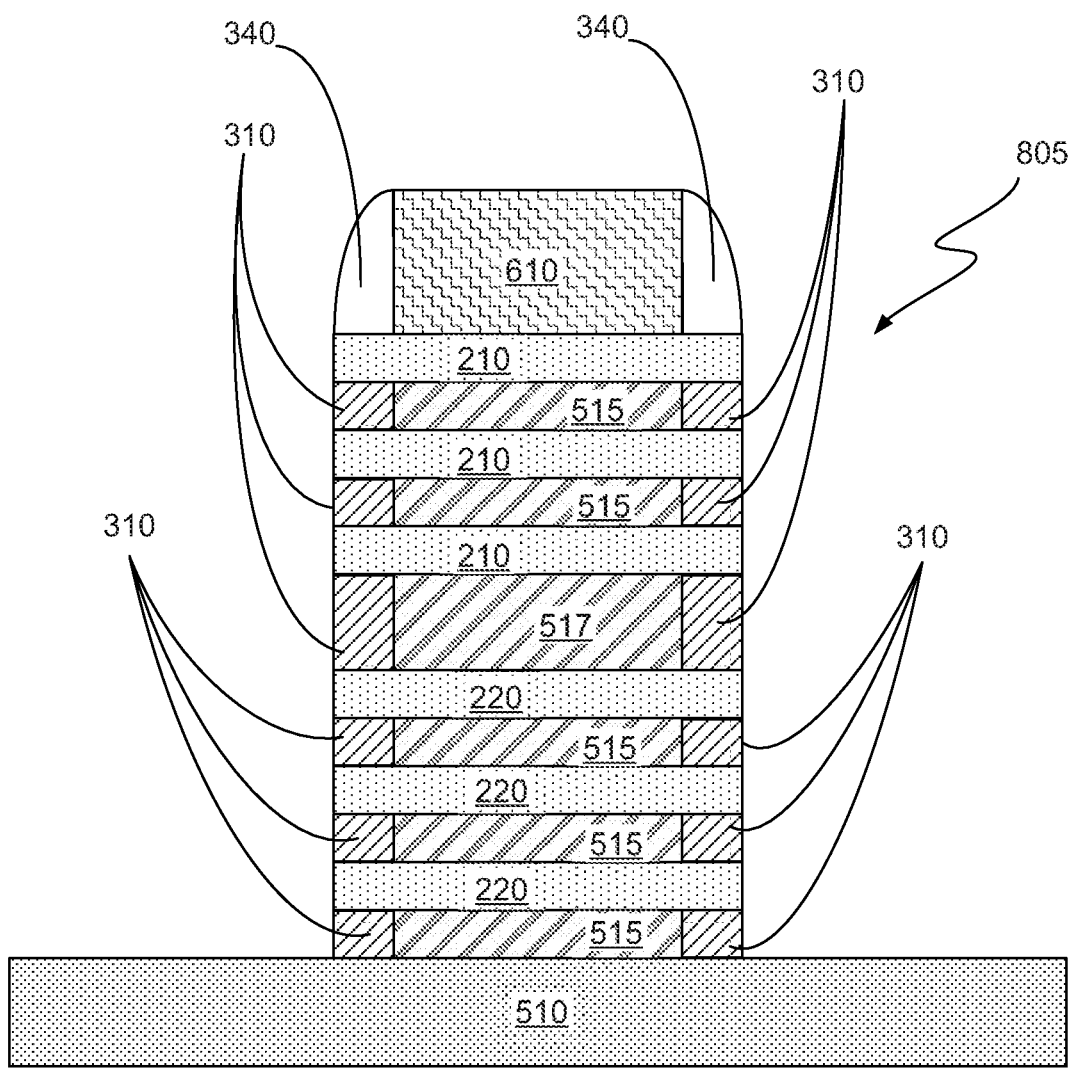

FIG. 8 depicts the formation of stack portion, 805, which includes spacers 310 between the layers of silicon channels 210 and 220. In this embodiment, the end portions of Silicon-Germanium are etched back, to create openings between the layers of silicon channels 210 and 220, while leaving the layers of silicon channels 210 and 220 relatively unchanged. The openings between the layers of silicon channels 210 and 220 are then backfilled with spacer material and excess spacer material is removed resulting in the formation of spacers 310. In this embodiment, spacers 310 are composed of SiN or SIBCN. In one embodiment, portions of substrate 510 that are beneath, or are immediately surrounding the bottom of, stack portion 805 are modified to include a dielectric isolation layer.

Figure 9:
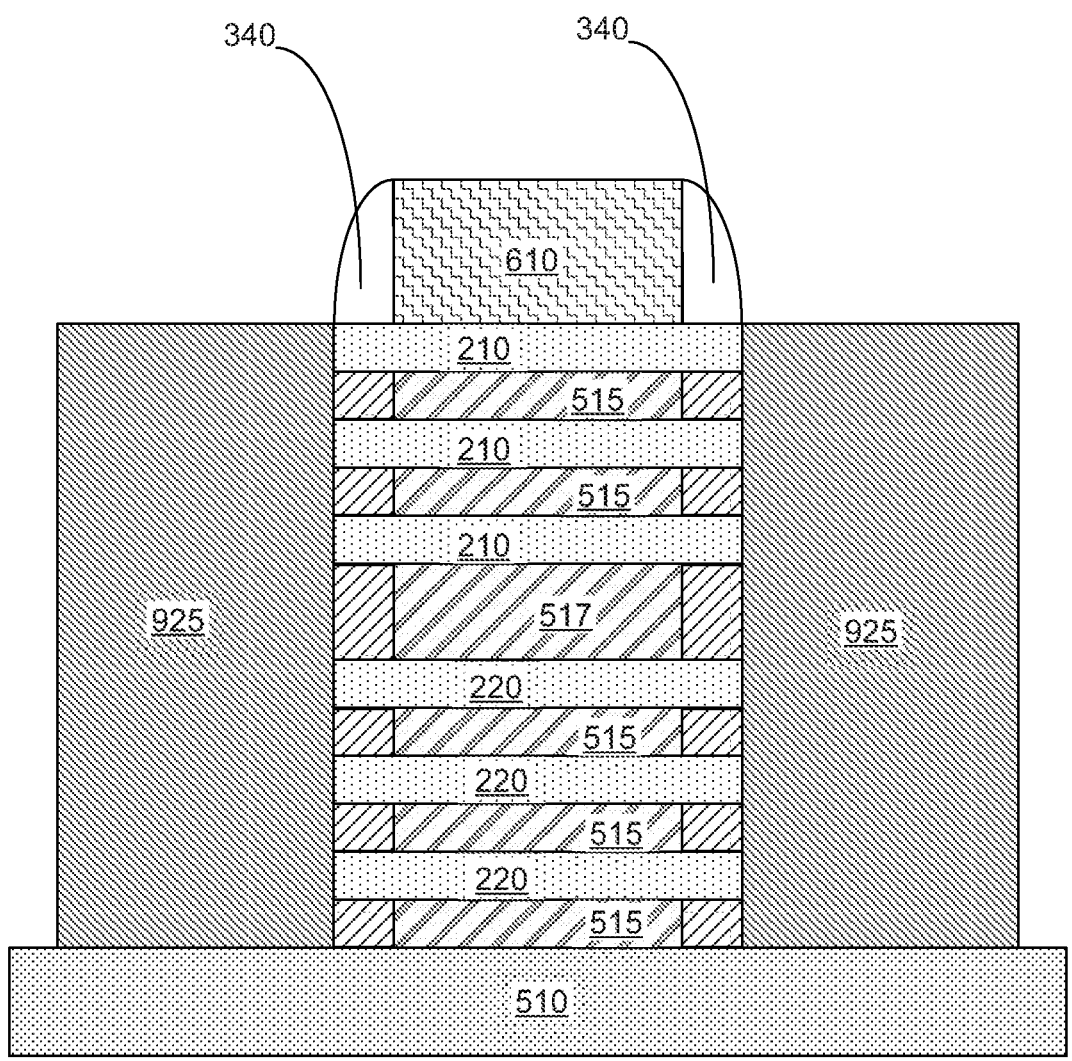

FIG. 9 depicts the formation of portions of Silicon-Germanium doped with Boron (SiGe:B), 925. In this embodiment, portions of SiGe:B 925 are formed using epitaxial growth of SiGe:B for pFET source drain areas. Note that, for ease of understanding, certain previously numbered parts may be unnumbered in some subsequent Figures.

Figure 10:
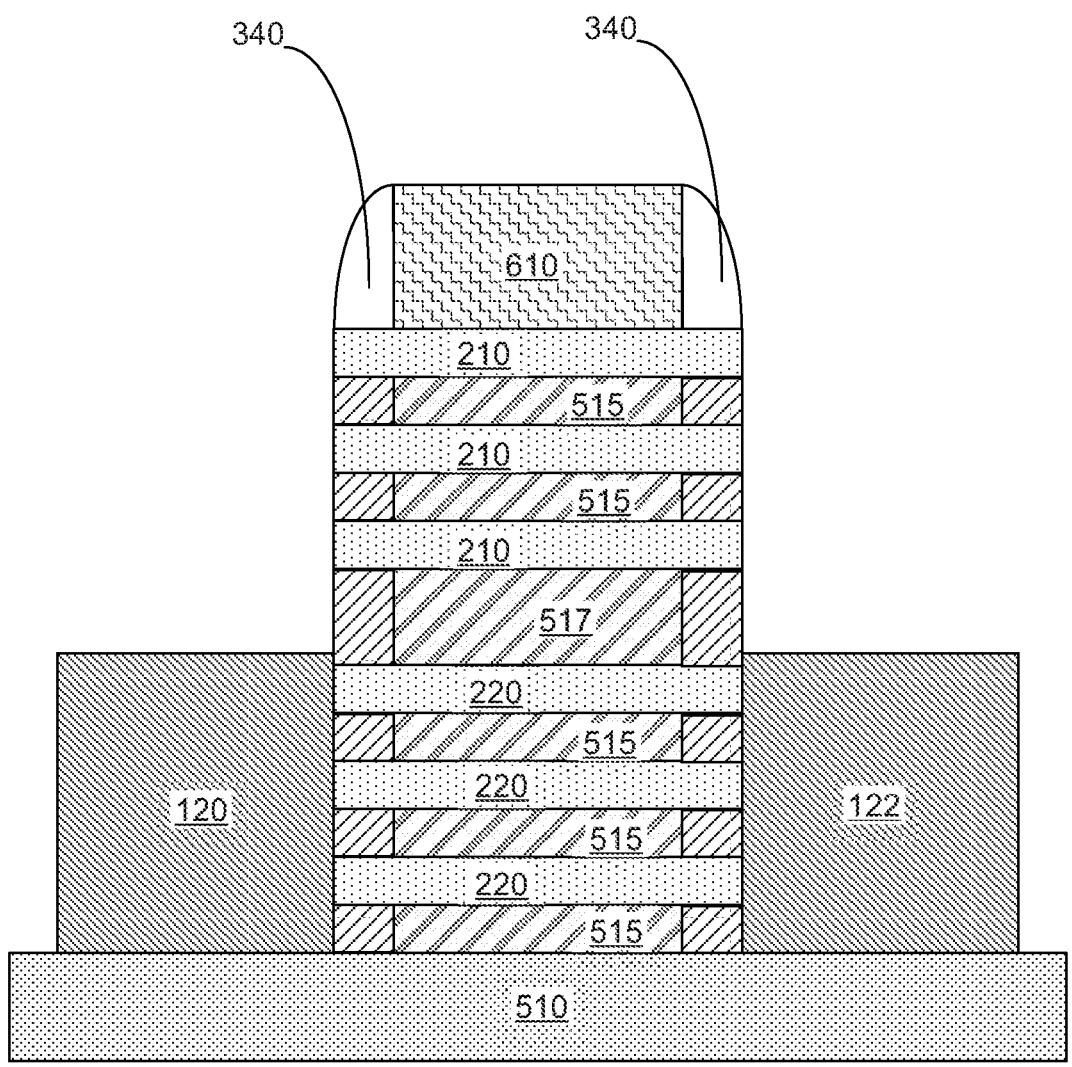

FIG. 10 depicts the formation of source/drain regions 120 and 122 by etching away portions of SiGe:B 925.

Figure 11:
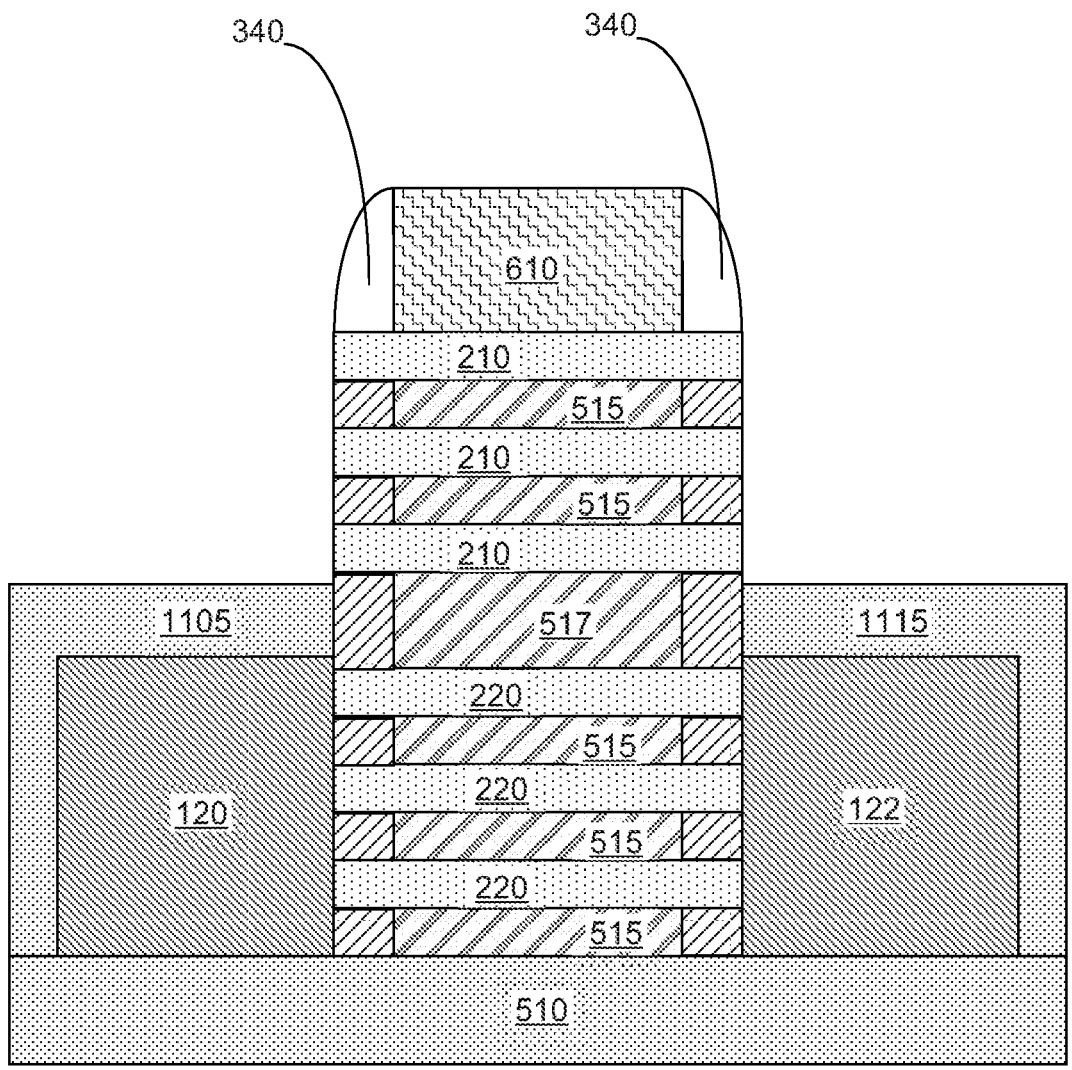

FIG. 11 depicts the formation of layers of interlayer dielectric (ILD), e.g., Silicon oxide, 1105 and 1115. Interlayer dielectric 1105 and 1115 form isolation layers respectively surrounding source/drain regions 120 and 122 as shown. Interlayer dielectric 1105 and 1115 may be formed using a dielectric material including inorganic dielectrics or organic dielectrics, and is either porous or non-porous, or a combination thereof. Examples of suitable dielectrics include, but are not limited to, SiC, $Si_3N_4$, $SiO_2$, a carbon doped oxide, SiC(N,H), a low-K dielectric, or multilayers thereof.

Figure 12:
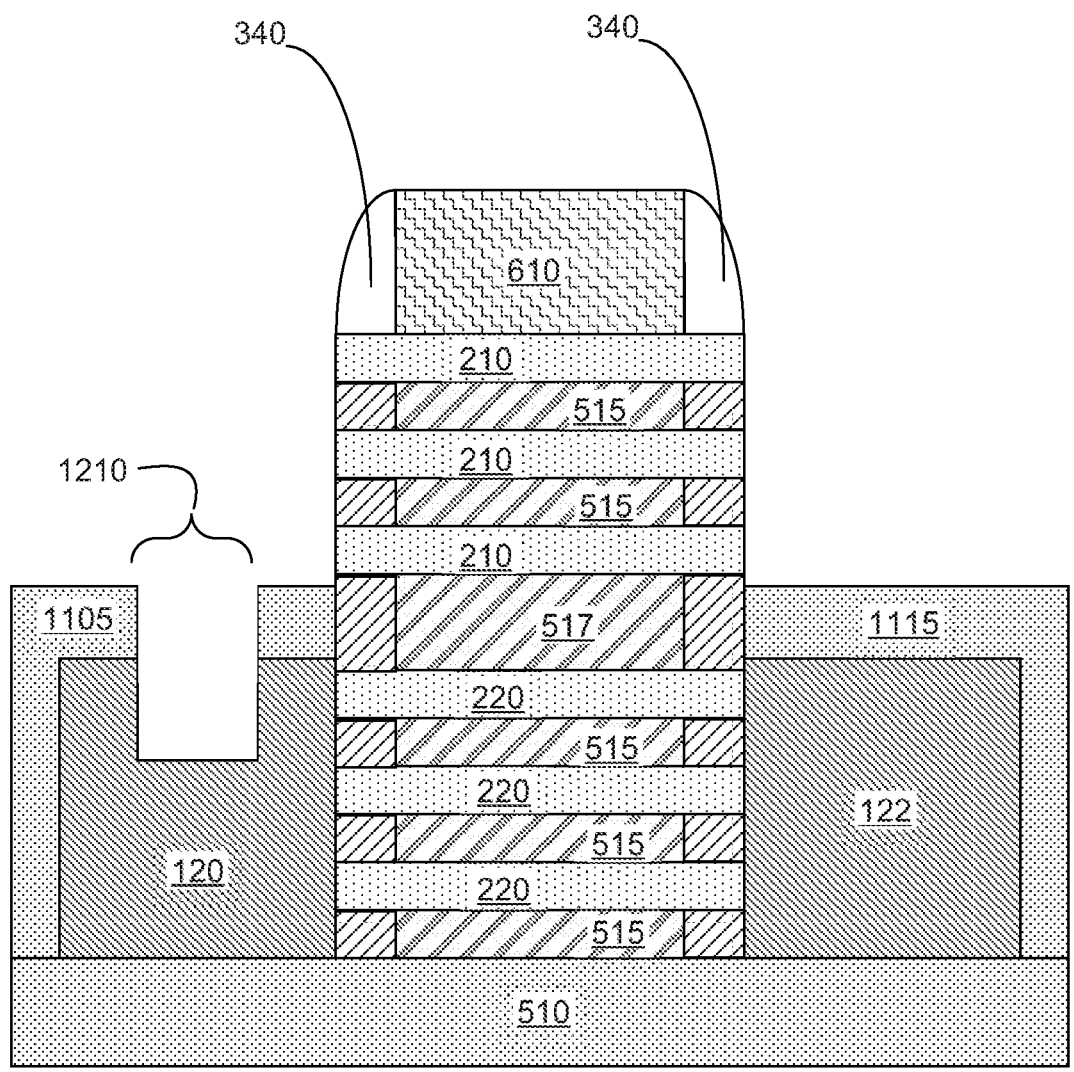
Figure 13:
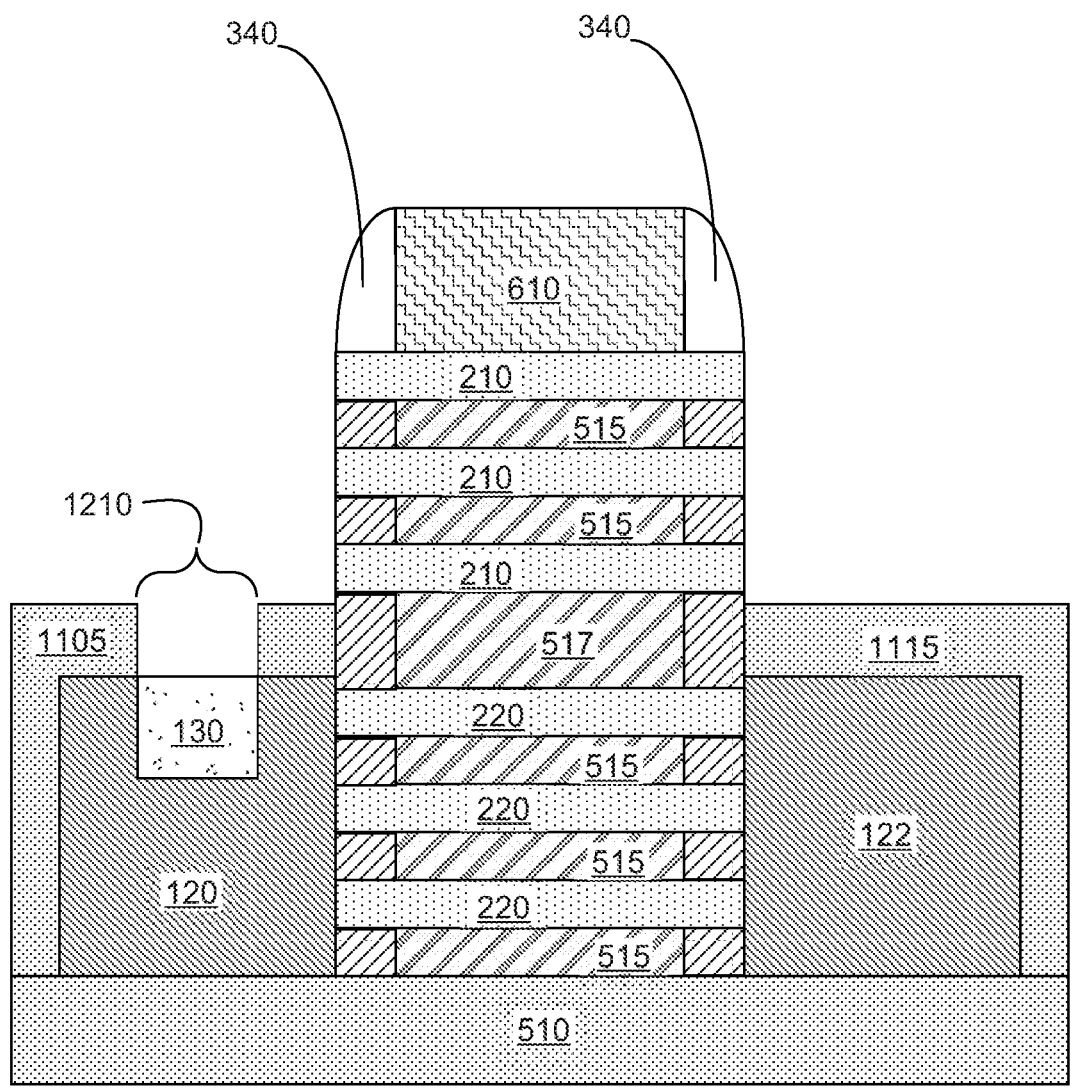

FIG. 12 depicts the formation of an opening, indicated by bracket 1210, in interlayer dielectric 1105 and source/drain regions 120. FIG. 13 depicts the formation of electrical contact 130 in a portion of the opening in interlayer dielectric 1105 that is included in source/drain regions 120. In this embodiment, the remaining portion of cavity indicated by bracket 1210, included in interlayer dielectric 1105, is then backfilled with additional flowable oxide material.

Figure 14:
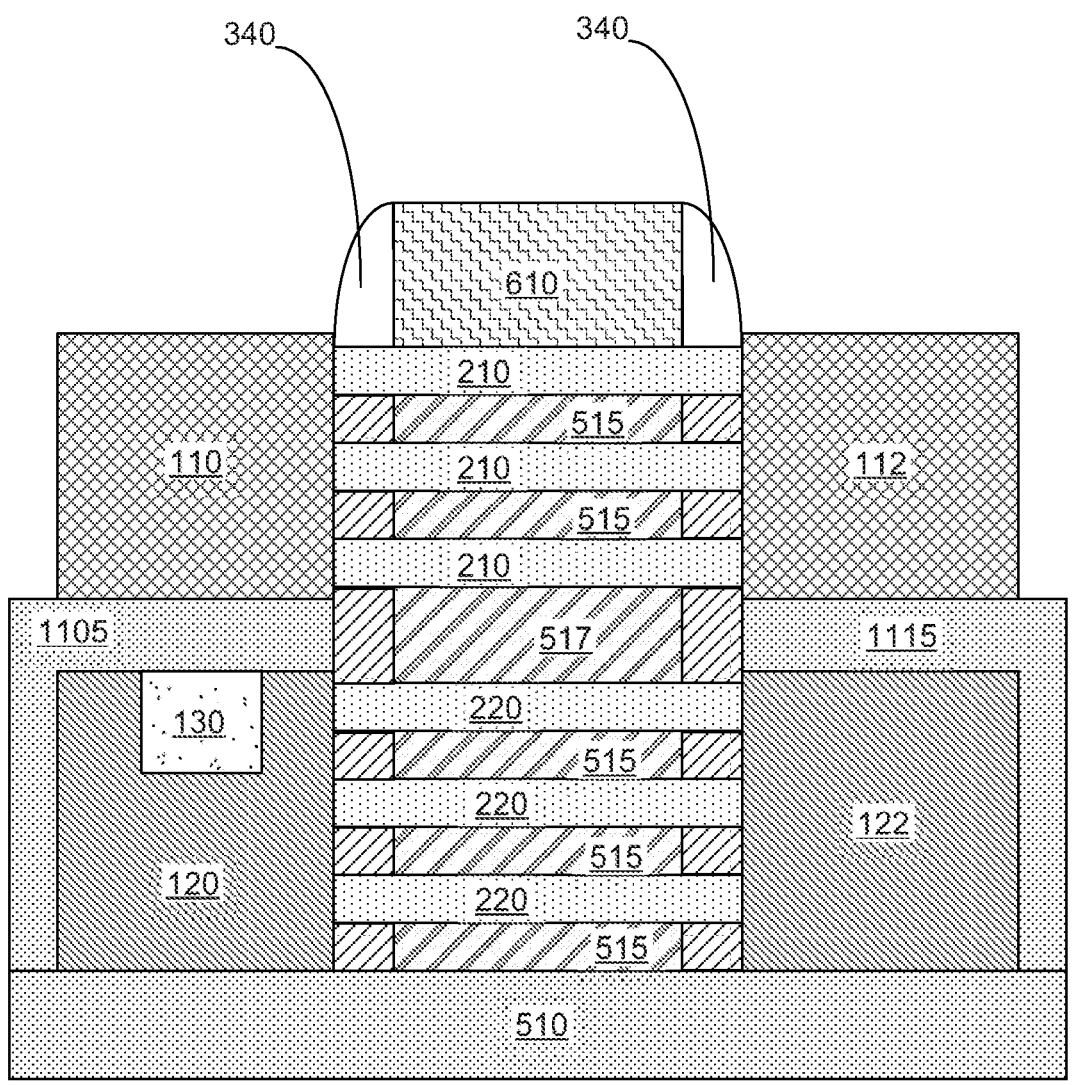
Figure 15:
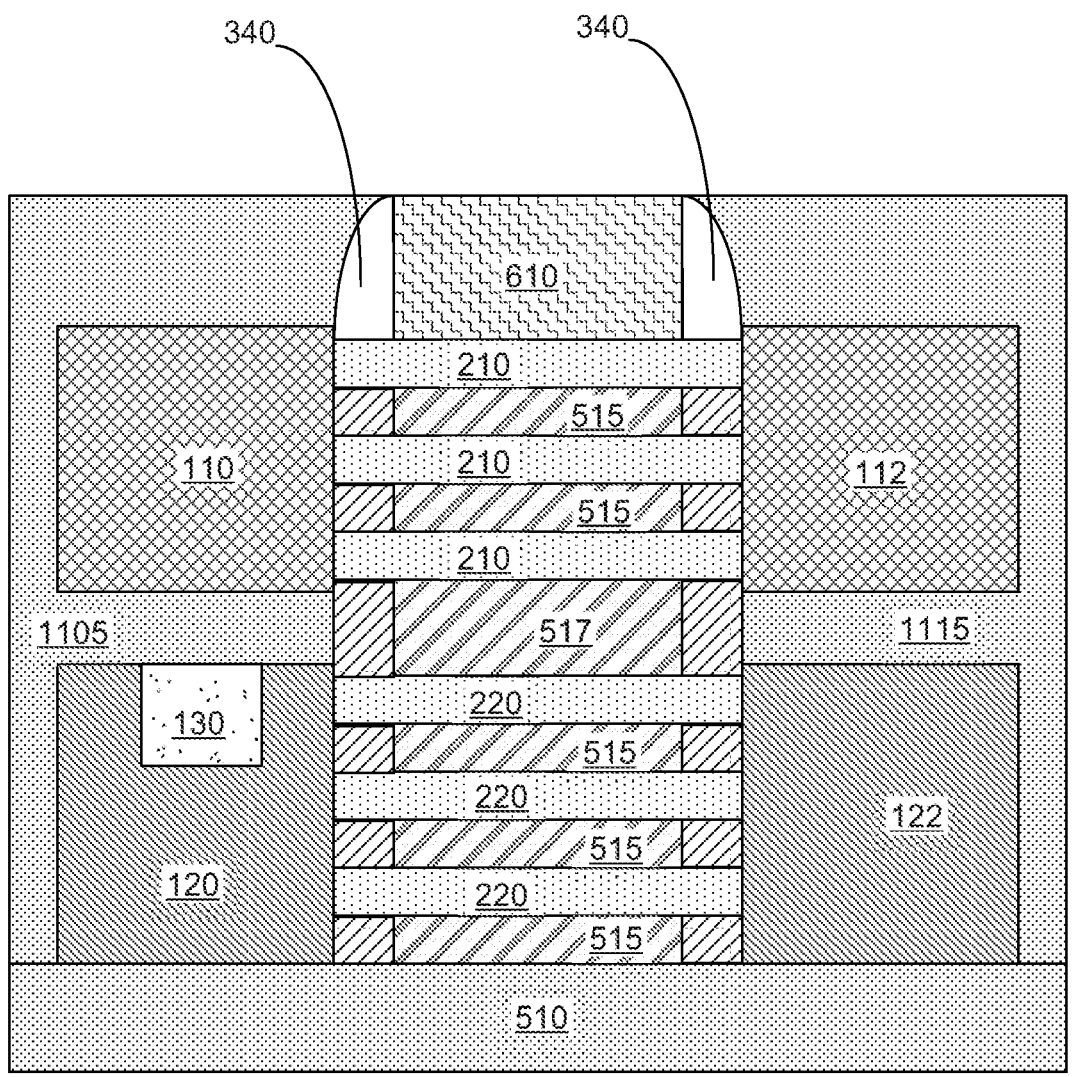

FIG. 14 depicts the formation of source/drain regions 110 and 112 by etching away portions of a layer of deposited silicon that is doped with phosphorus (Si:P). FIG. 15 depicts the formation of extension layers of flowable oxide that extend the thickness of interlayer dielectric 1105 and 1115 such that they respectively cover the tops of source/drain regions 110 and 112.

Figure 16:
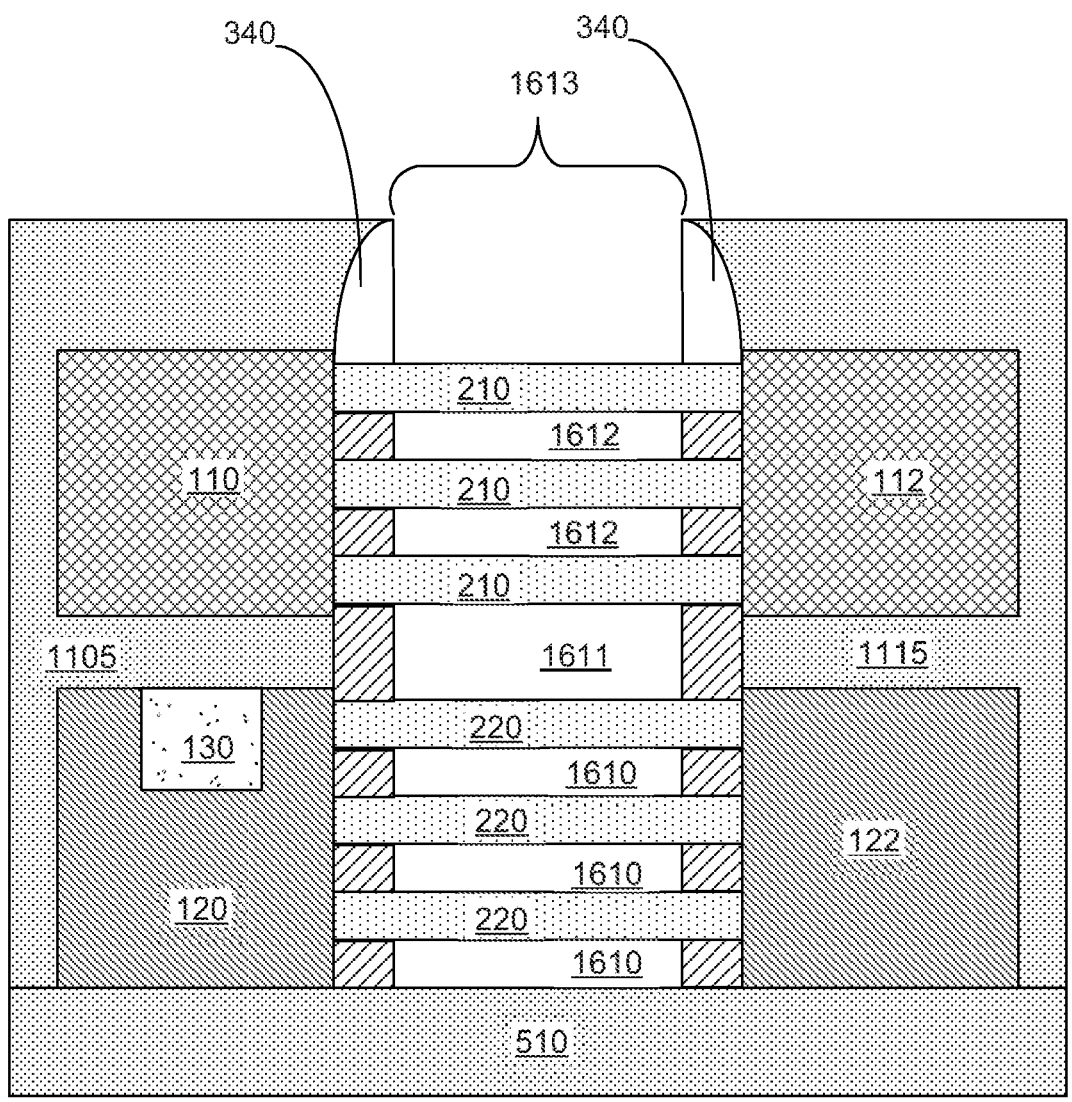

FIG. 16 depicts the removal of dummy gate material 610 and sacrificial material 515 and 517, i.e., SiGe channel release using an isotropic etch of the SiGe. For example, in one embodiment, dummy gate removal is achieved via etching amorphous Si (dummy gate material) with ammonia, and SiGe channel release is accomplished via HCl gas or wet etch (HCl). The removal of this material creates openings 1610, 1611, 1612, and 1613. Note opening 1613 is denoted using a bracket.

Figure 17:
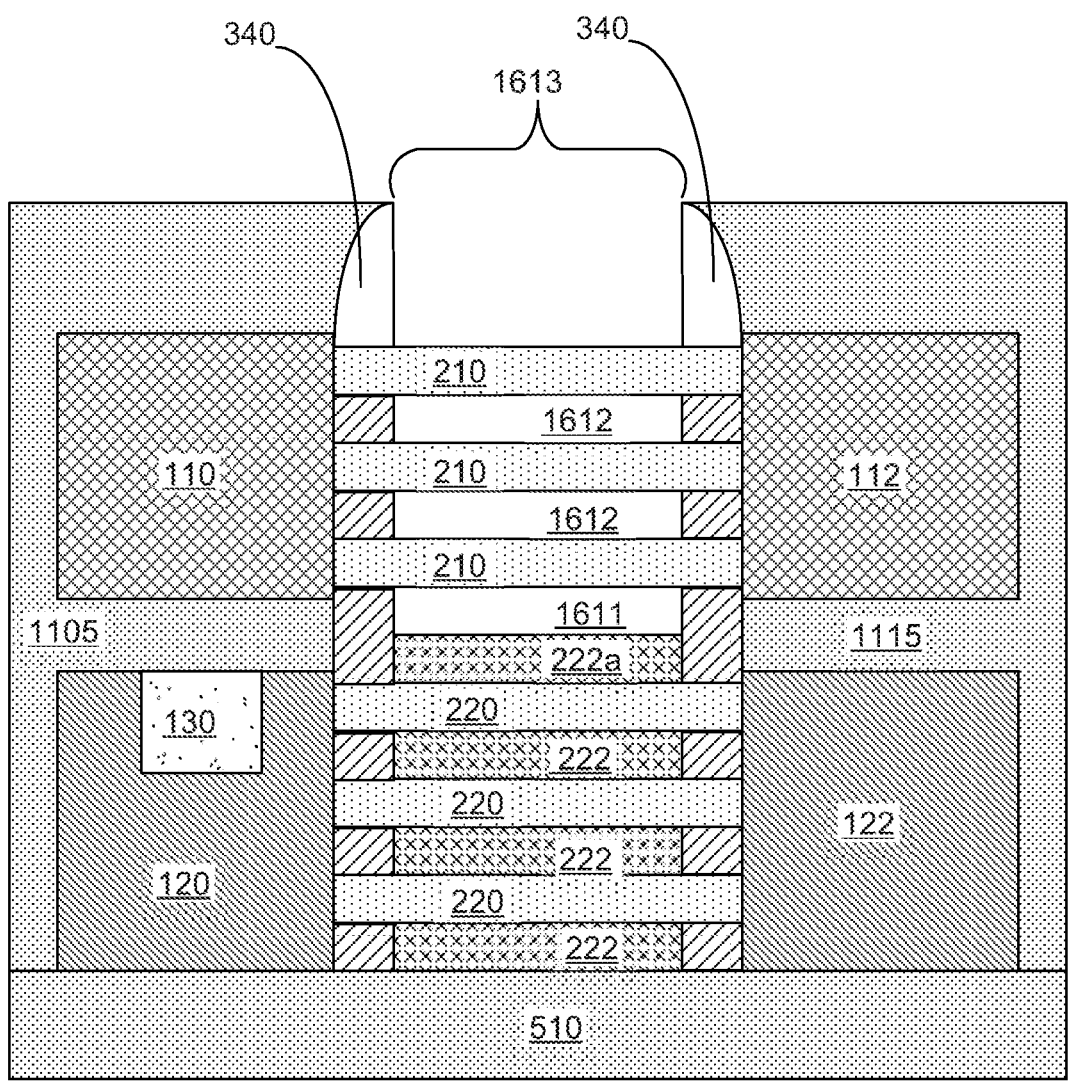

FIG. 17 depicts the formation of portions of storage dielectric 222 and 222a by deposition of storage dielectric material, which backfills all of the openings 1610 and half of opening 1611. In this embodiment, the storage dielectric is flowable oxide (FOX) is annealed at 400° C. to form silicon quantum dots in the flowable oxide that can trap charge. Polymer hydrogen silsesquioxane (HSQ) solution in methyl isobutyl ketone (MIBK), commercially known as FOX (flowable oxide), is an alternative material to silicon dioxide and is obtained by chemical deposition. Standard process to obtain amorphous $SiO_2$ film from polymer HSQ includes: deposition by spin coating, removal of solvent by soft-bake on hotplate, and oxidation of materials by heating in an oven or oxygen plasma treatment. Having parameters similar to those of $SiO_2$, polymer HSQ after soft-bake, is sensitive to an electron beam and also to wavelengths below $\lambda=157$ nm. Removal of FOX after hard-bake is possible with dry etching or using HF solution. Embodiments recognize that other storage dielectrics may be used, which may or may not form quantum dots.

Figure 18:
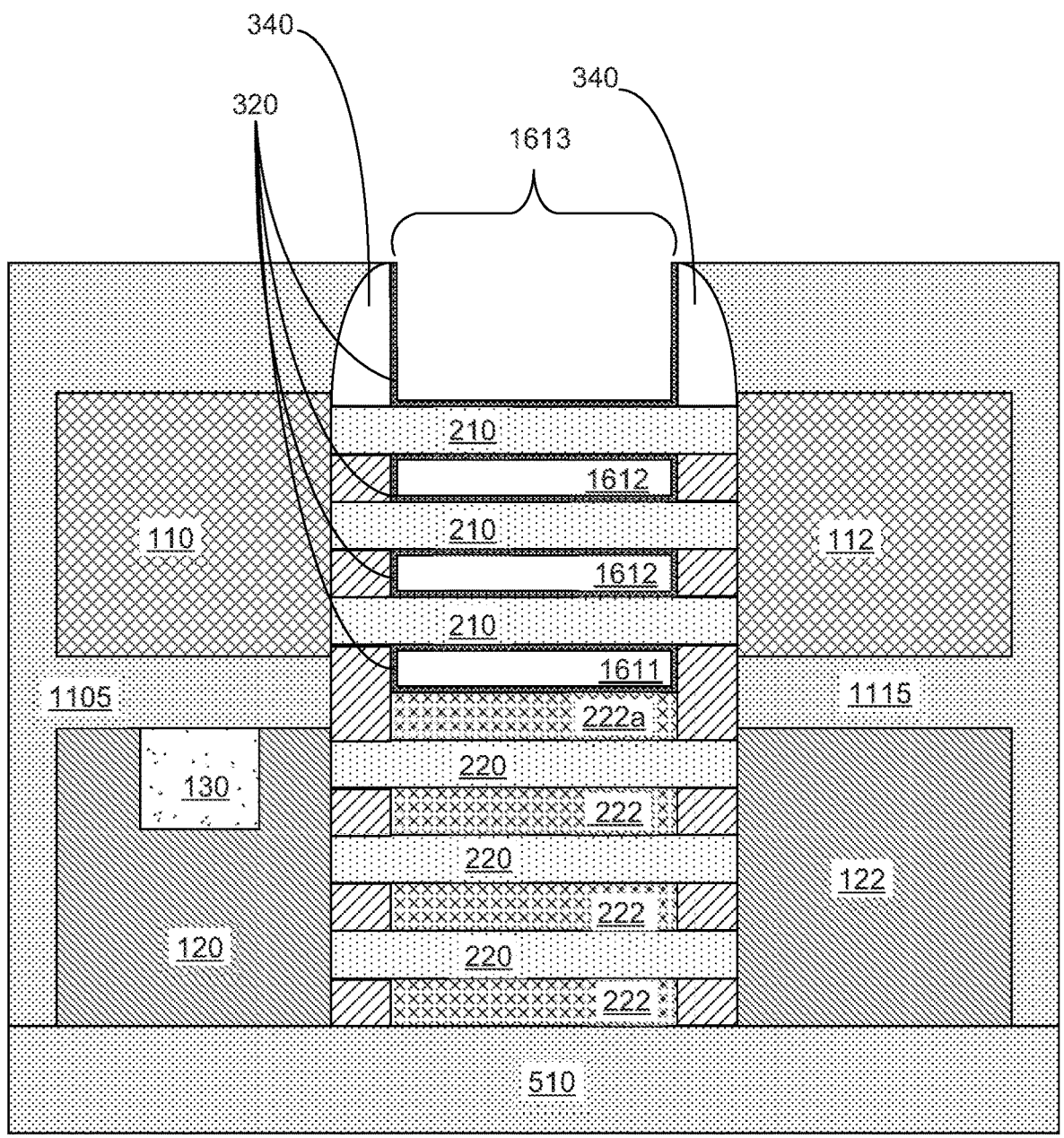

FIG. 18 depicts the formation of a layer of high-k dielectric material 320 within, and coating the exposed surfaces of, openings 1611, 1612, and 1613. The formation of high-k dielectric material 320 may further include forming a subsequent layer of WFM on top of high-k dielectric material 320. In this embodiment, the high-k dielectric material 320 is composed of hafnium (IV) oxide ($HfO_2$). Other examples of high-k dielectrics include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 19:
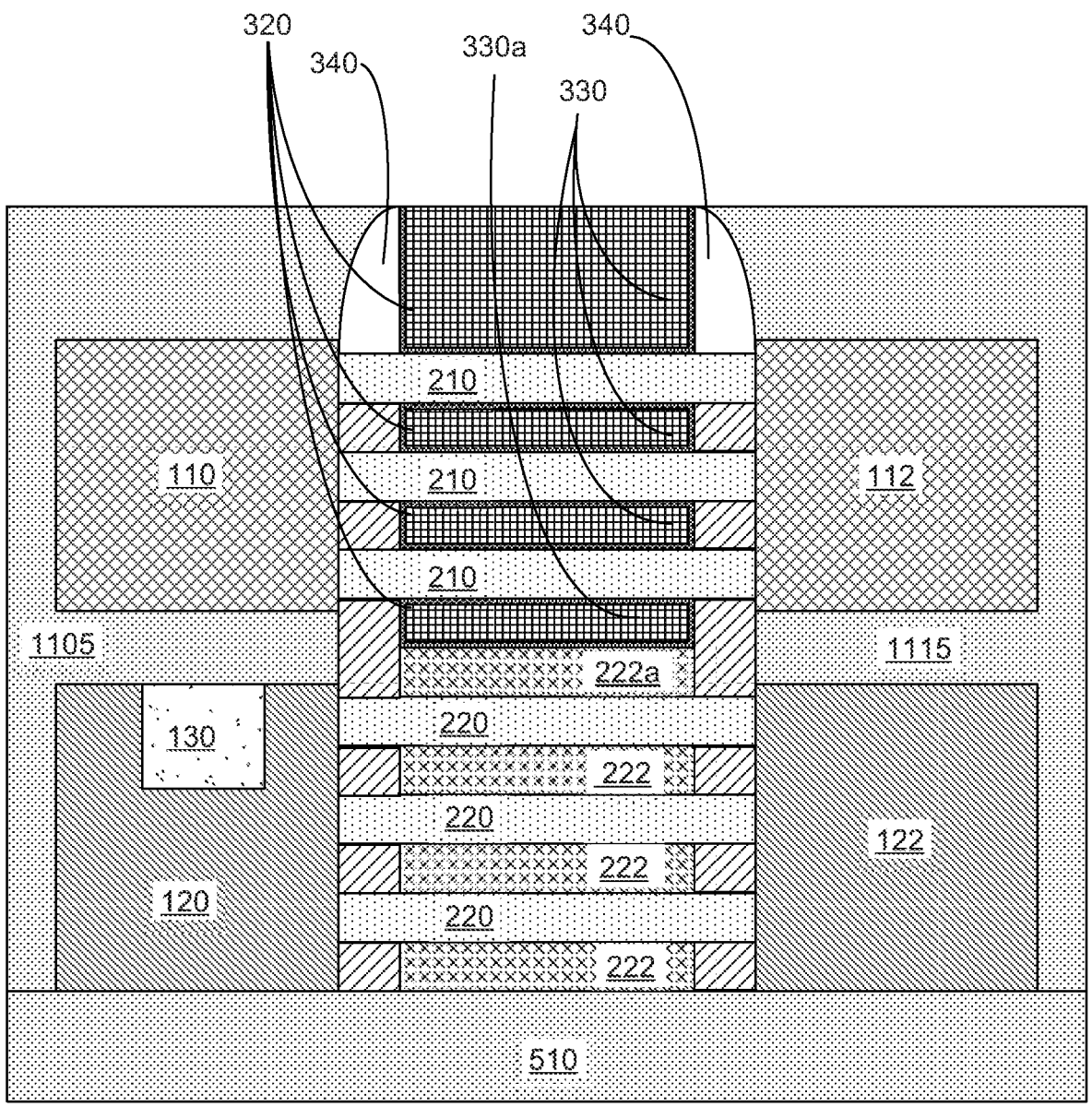

FIG. 19 depicts the formation of layers of gate material, 330 and 330a, within the openings 1611, 1612, and 1613. In general, gate material 330 and 330a represents a bulk gate material. Openings 1611, 1612, and 1613 are backfilled with a gate material, which is known in the art. In this embodiment, the layers of gate material are composed of titanium nitride (TiN). In general, the layers of gate material comprise electrically conductive material.

Figure 20:
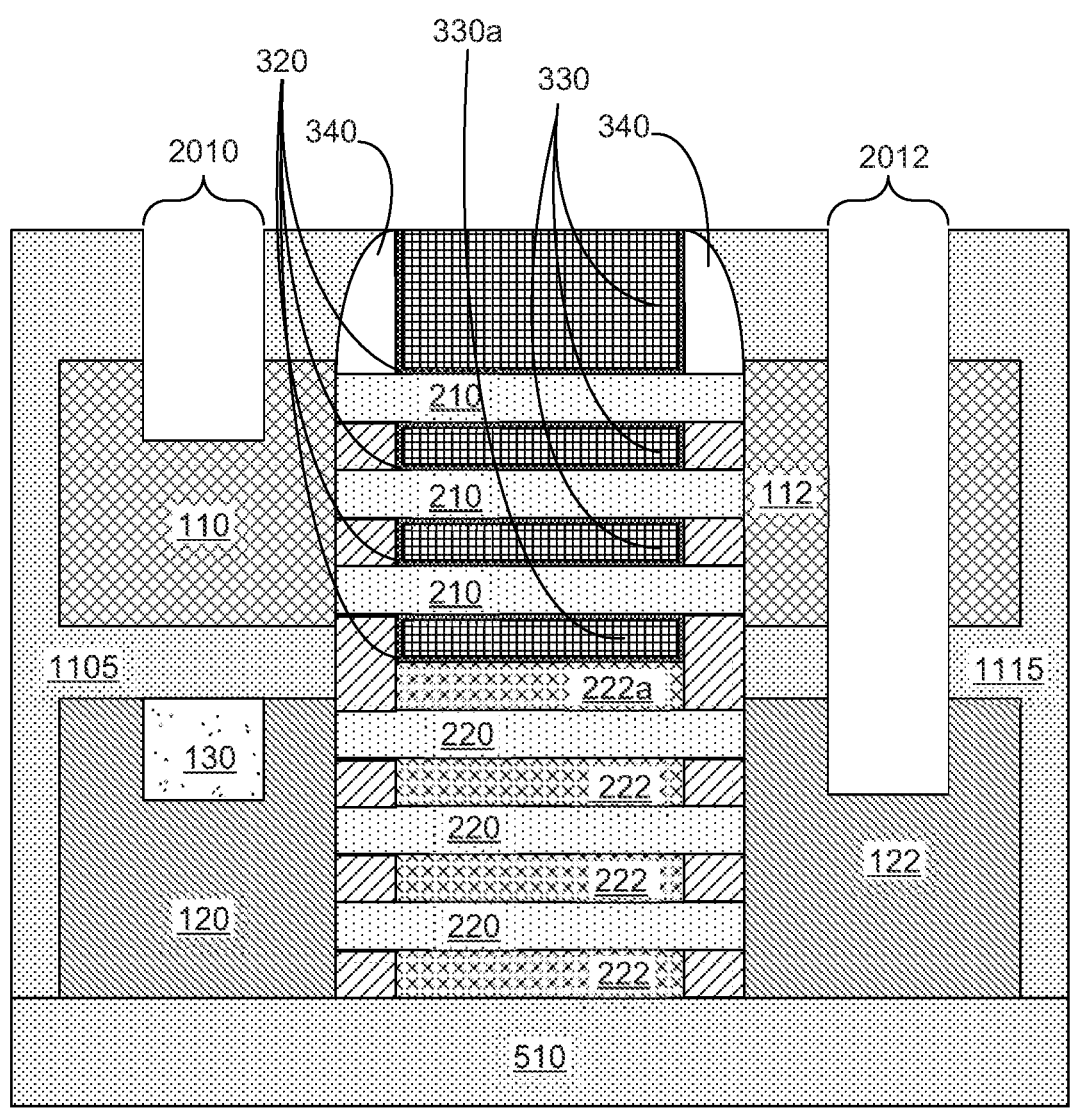

FIG. 20 depicts the formation of openings 2010 and 2012. Opening 2010 extends (i) through a first portion of interlayer dielectric 1105 that covers source/drain region 110, and (ii) into source/drain region 110. Opening 2012 extends (i) through a first portion of interlayer dielectric 1115 that covers source/drain region 112, (ii) through source/drain region 112, (iii) through a second portion of interlayer dielectric 1115 that is located between source/drain regions 112 and 122, and (iv) into source/drain region 120.

FIG. 21 depicts one embodiment in which openings 2010 and 2012 are completely filled with conductive material to form electrical contacts 140 and 142. The conductive material can be any conductive material such as tungsten, titanium, titanium nitride, copper, or any suitable combination of those materials. Note that the top surface of electrical contact 142 is planar with the top surface of interlayer dielectric 1115 and electrical contact 140. The interlayer dielectric 1105 and 1115 may be used to cover electrical contacts 140 and 142, which is then subjected to a chemical-mechanical polish (CMP) to expose the top surfaces of electrical contacts 140 and 142. Both FIGS. 21 and 22 include gate electrode 2100 that has been formed and is comprises and electrical connection to gate material 330 and 330a. One having ordinary skill in the art will readily recognize that the structure depicted in FIG. 21 comprises a Complementary Metal Oxide Silicon (CMOS) programmable inverter structure. Further, one having ordinary skill in the art will readily recognize that the structure depicted in FIG. 21 does not limit the structure to only this configuration since such a CMOS programmable inverter structure can comprise a shared drain is connected to $V_{OUT}$ with either (i) an nFET stacked on top of an pFET or (ii) a pFET stacked on top of an nFET without deviation from the scope of the invention.

FIG. 22 depicts one embodiment of a semiconductor device with a floating electrical contact 142. In one such embodiment, after electrical contacts 140 and 142 are formed, electrical contact 142 is etched back, i.e., reduced in height, to form a cavity that is then filled with interlayer dielectric material. As such, the top of electrical contact 142 is covered by interlayer dielectric 1115, as indicated by the dashed oval 2200 in FIG. 22. In some embodiments, as an alternative to etching back electrical contact 142, additional interlayer dielectric material is deposited on top of electrical contact 142 such that electrical contacts 140 and 142 retain the same height, i.e., their respective top surfaces are in plane with each other. One having ordinary skill in the art will readily recognize that the structure depicted in FIG. 22 comprises a Complementary Metal Oxide Silicon (CMOS)/Erasable Programmable Read-Only Memory (EPROM) cell. Further, one having ordinary skill in the art will readily recognize that the structure depicted in FIG. 22 does not limit the structure to only this configuration since such a CMOS/EPROM cell can comprise either (i) an nFET stacked on top of a floating-gate pFET or (ii) a pFET stacked on top of a floating-gate nFET without deviation from the scope of the invention.

In one embodiment, portions of a threshold voltage adjusting material are formed on a layer of high-k dielectric 320 of the semiconductor structure of FIG. 18. In this embodiment, a work-function adjusting material (for example, lanthanum oxide ($La_2O_3$)) is deposited and diffused into the exposed portions of the layer of high-k dielectric 320, i.e., the exposed surface of layer of high-k dielectric 320. The diffusion of such a work-function adjusting material into the exposed portions of the layer of high-k dielectric 320 changes the threshold voltage of the exposed portions of the layer of high-k dielectric 320. When the semiconductor structure is an nFET, lanthanum oxide reduces its threshold voltage. When the semiconductor structure is a pFET, lanthanum oxide increases its threshold voltage. In another embodiment, the work-function adjusting material is aluminum or aluminum oxide. When aluminum or aluminum oxide is incorporated into a layer of high-k material, it raises nFET threshold voltage and reduces pFET threshold voltage. As such, the diffusion process results in the formation of work-function adjusted portions of layer of high-k dielectric 320, which have a different threshold voltage when compared to a layer of high-k dielectric 320 yields by itself. In general, such work-function adjusted portions are composed of a threshold-voltage adjusting material that causes a difference in the threshold voltage during inversion and accumulation of the resulting semiconductor devices (when operating).

The resulting work-function portions may be "n"-directional such as those produced through the diffusion of an element selected from the combination of groups IIA and IIIB of the periodic table of the elements, for instance lanthanum. Alternatively, an "n"-directional work-function portions may be an oxide of at least one element selected from the combination of groups IIA and IIIB of the periodic table of the elements, for instance lanthanum oxide. Alternatively, work-function portions may also be "p"-directional, such as a material that results from the diffusion of aluminum or aluminum oxide into the exposed portions of the layer of high-k dielectric 320.

Embodiments recognize that polysilicon may be a preferred material in the art for forming gate structures. However, this should not limit the large number of materials and spatial arrangements that are known in the art as possibilities for formation of a gate conductive layer/structure/device. In certain embodiments, there may be only one layer of material, or there may be multiple conductive layers over work-function portions. Examples of materials known in the art that may be used for such gate structures include (without limitation) one or more of: polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. Such processes and materials are well understood by those skilled in the art and, therefore, further discussion of them is omitted for brevity.

The formation of the source/drain structures may include epitaxy, doping, annealing, silicidation, or any suitable combination of those techniques.

Electrical connections (not shown) may be made to one or more of the electrical contacts, sources, drains, and/or gate structures shown in FIGS. 1-22, and substrate 510 may be grounded. Generally, if there is no gate voltage, or the gate voltage is below a threshold, on the gate between a given pair of source and drain structures, then there is no electrical current flowing, i.e., no electrical connection, between those source and drain structures. As voltage (of the correct polarity and strength) is applied to the gate, a "field effect" is generated in the channel between the source and the drain, and current can flow between the source and the drain. In this manner, a small signal (gate voltage) controls a relatively large signal current that can flow between the source and the drain. The floating gate transistor (bottom p-FET in this embodiment) lacks a control gate. In one such embodiment, the programming of the floating gate transistor is performed by applying a sufficiently large programming voltage across the source/drain regions 120 and 122 to generate hot carriers for trapping into the floating gate.

According to one embodiment of the present disclosure, a semiconductor structure is provided. The semiconductor structure includes a first transistor device stacked on top of a second transistor device, wherein the source and drain structures of the first transistor device are aligned with the source and drain structures of the second transistor device.

According to one embodiment of the present disclosure, the semiconductor structure includes a gate structure that controls a channel between the source and drain structures of the first transistor device.

According to one embodiment of the present disclosure, the semiconductor structure includes a stack of materials that (i) connects the source and drain structures of the first transistor device and (ii) connects the source and drain structures of the second transistor device.

According to one embodiment of the present disclosure, the first transistor device includes a first source/drain structure that is connected to a second source/drain structure by a first set of layered materials. According to one embodiment of the present disclosure, the second transistor device includes a third source/drain structure that is connected to a fourth source/drain structure by a second set of layered materials that is different from the first set of layered materials.

According to one embodiment of the present disclosure, the first set of layered materials includes alternating layers of silicon and gate material. The second set of layered materials includes alternating layers of silicon and storage dielectric.

According to one embodiment of the present disclosure, the second set of layered materials includes layers of material that can form quantum dots.

According to one embodiment of the present disclosure, the second set of layered materials includes layers of annealed silicon oxide.

According to one embodiment of the present disclosure, each of the source and drain structures of the first transistor device second transistor device are physically connected to one of three electrical contacts.

According to one embodiment of the present disclosure, the semiconductor structure includes a first electrical contact, of the three electrical contacts, that is connected to a first source and drain structure of the first transistor device.

According to one embodiment of the present disclosure, the semiconductor structure includes a second electrical contact, of the three electrical contacts, that connects a second source and drain structure of the first transistor device to a third source and drain structure of the second transistor device, wherein the third source and drain structure is located beneath the first source and drain structure.

According to one embodiment of the present disclosure, the semiconductor structure includes a third electrical contact, of the three electrical contacts, that is routed from outside the drawing plane and is in electrical contact with a top of a fourth source and drain structure of the second transistor device.

According to one embodiment of the present disclosure, the second electrical contact is a shared drain terminal that has a top surface that is covered by dielectric material.

According to one embodiment of the present disclosure, the first transistor device and the second transistor device comprise a pair of transistor devices that comprise one nFET transistor device and one pFET transistor device.

According to one embodiment of the present disclosure, the semiconductor structure comprises one of either (i) a Complementary Metal Oxide Silicon (CMOS)/Erasable Programmable Read-Only Memory (EPROM) cell or (ii) a CMOS programmable inverter structure. According to one embodiment of the present disclosure, the CMOS/EPROM cell comprises either (i) an nFET stacked on top of a floating-gate pFET or (ii) a pFET stacked on top of a floating-gate nFET. According to one embodiment of the present disclosure, the CMOS programmable inverter structure comprises a shared drain that is electrically connected to a signal out terminal ($V_{out}$) and either (i) an nFET stacked on top of an pFET or (ii) a pFET stacked on top of an nFET.

According to one embodiment of the present disclosure, a method of forming a semiconductor structure is provided. The method includes: forming a first transistor device on top of a second transistor device, wherein the source and drain structures of the first transistor device are aligned with the source and drain structures of the second transistor device.

According to one embodiment of the present disclosure, the first transistor device and the second transistor device comprise a pair of transistor devices that comprise one nFET transistor device and one pFET transistor device.

According to one embodiment of the present disclosure, the semiconductor structure comprises one of either (i) a Complementary Metal Oxide Silicon (CMOS)/Erasable Programmable Read-Only Memory (EPROM) cell or (ii) a CMOS programmable inverter structure. According to one embodiment of the present disclosure, the CMOS/EPROM cell comprises either (i) an nFET stacked on top of a floating-gate pFET or (ii) a pFET stacked on top of a floating-gate nFET. According to one embodiment of the present disclosure, the CMOS programmable inverter structure comprises a shared drain that is electrically connected to a signal out terminal ($V_{out}$) and either (i) an nFET stacked on top of an pFET or (ii) a pFET stacked on top of an nFET.

According to a first embodiment of the present disclosure, a semiconductor structure is disclosed that includes an erasable programmable read-only memory (EPROM) bit cell. The EPROM is comprised of a stacked pair of field-effect transistors that include a nano-sheet n-channel field-effect transistor (n-FET) stacked with a nano-sheet p-channel field-effect transistor (p-FET).

According to one such embodiment of the present disclosure, a gate terminal of a first field-effect transistor (FET), of the stacked pair of field-effect transistors, is connected to a word-line, wherein the first FET is either an n-FET or a p-FET.

According to one such embodiment of the present disclosure, a first source/drain terminal of the first FET is connected to a select-line. According to one such embodiment of the present disclosure, a second source/drain terminal of the first FET is connected to a first source/drain terminal of a second field-effect transistor (FET) of the stacked pair of field-effect transistors.

According to one such embodiment of the present disclosure, the second FET is either an n-FET or a p-FET such that the stacked pair of field-effect transistors includes one n-FET and one p-FET. According to one such embodiment of the present disclosure, a gate of the second FET is electrically floating. According to one such embodiment of the present disclosure, a second source/drain terminal of the second FET is connected to a bit-line.

According to one such embodiment of the present disclosure, the gate of the second FET is comprised of a storage dielectric. According to one such embodiment of the present disclosure, the storage dielectric includes quantum dots within it. According to one such embodiment of the present disclosure, the storage dielectric is comprised of silicon oxide with silicon nano-dots within the silicon oxide. According to one such embodiment of the present disclosure, the silicon oxide and the silicon nano-dots comprise an annealed flowable oxide.

According to a second embodiment of the present disclosure, a semiconductor structure is disclosed that includes an erasable programmable read-only inverter that is comprised of a stacked pair of field-effect transistors that include a nano-sheet n-channel field-effect transistor (n-FET) stacked with a nano-sheet p-channel field-effect transistor (p-FET).

According to one such embodiment of the present disclosure, a gate terminal of a first field-effect transistor (FET), of the stacked pair of field-effect transistors, is connected to an input line. According to one such embodiment of the present disclosure, a first source/drain terminal of the first FET is connected to a first power supply line.

According to one such embodiment of the present disclosure, a second source/drain terminal of the first FET is connected to both of (i) a first source/drain terminal of a second FET and (ii) an output line. According to one such embodiment of the present disclosure, a gate of the second FET is electrically floating, and a second source/drain of the second FET is connected to a second power supply line. According to one such embodiment of the present disclosure, the gate of the second FET is comprised of a storage dielectric. According to one such embodiment of the present disclosure, the storage dielectric includes quantum dots within it. According to one such embodiment of the present disclosure, the storage dielectric is comprised of silicon oxide with silicon nano-dots within the silicon oxide. According to one such embodiment of the present disclosure, the silicon oxide and the silicon nano-dots comprise an annealed flowable oxide.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor structure that includes an erasable programmable read-only memory (EPROM) bit cell, the EPROM bit cell comprising:
    a stacked pair of field-effect transistors including a first field-effect transistor (FET) and a second FET, the first FET having a first gate terminal connected to a word-line and a first source/drain terminal connected to a select-line;
    wherein: the first and second FET are horizontal nano-sheet FETs (HNS-FETs).

2. The EPROM bit cell of claim 1, wherein the first FET is an n-FET.

3. The EPROM bit cell of claim 2, wherein the second FET is a p-FET.

4. The EPROM bit cell of claim 1, wherein a second source/drain terminal of the first FET is connected to a first source/drain terminal of the second FET.

5. The EPROM bit cell of claim 4, wherein a second source/drain terminal of the second FET is connected to a bit-line.

6. The EPROM bit cell of claim 1, wherein a second gate terminal of the second FET is an electrically floating gate.

7. The EPROM bit cell of claim 6, wherein the second gate terminal of the second FET is comprised of a storage dielectric.

8. The EPROM bit cell of claim 7, wherein the storage dielectric includes quantum dots.

9. The EPROM bit cell of claim 7, wherein the storage dielectric is comprised of silicon oxide having silicon nano-dots within the silicon oxide.

10. The EPROM bit cell of claim 9, wherein the silicon oxide and the silicon nano-dots comprise an annealed flowable oxide.

11. A semiconductor structure including an erasable programmable read-only inverter, the erasable programmable read-only inverter comprising:
    a stacked pair of field-effect transistors including a first field-effect transistor (FET) and a second FET, the first FET having a first gate terminal connected to an input line and a first source/drain terminal connected to a first power supply line;
    wherein: the first and second FET are horizontal nano-sheet FETs (HNS-FETs).

12. The erasable programmable read-only inverter of claim 11, wherein a second source/drain terminal of the first FET is connected to both of (i) a first source/drain terminal of the second FET and (ii) an output line.

13. The erasable programmable read-only inverter of claim 12, wherein a second gate terminal of the second FET is an electrically floating gate, and a second source/drain terminal of the second FET is connected to a second power supply line.

14. The erasable programmable read-only inverter of claim 13, wherein the second gate terminal of the second FET is comprised of a storage dielectric.

15. The erasable programmable read-only inverter of claim 14, wherein the storage dielectric includes quantum dots.

16. The erasable programmable read-only inverter of claim 15, wherein the storage dielectric is comprised of silicon oxide having silicon nano-dots within the silicon oxide.

* * * * *